(12) United States Patent
Kim

(10) Patent No.: US 11,729,908 B2
(45) Date of Patent: Aug. 15, 2023

(54) CIRCUIT STRUCTURE

(71) Applicant: Ticona LLC, Florence, KY (US)

(72) Inventor: Young Shin Kim, Cincinnati, OH (US)

(73) Assignee: Ticona LLC, Florence, KY (US)

( * ) Notice: Subject to any disclaimer, the term of this patent is extended or adjusted under 35 U.S.C. 154(b) by 345 days.

(21) Appl. No.: 17/178,312

(22) Filed: Feb. 18, 2021

(65) Prior Publication Data

US 2021/0274652 A1    Sep. 2, 2021

Related U.S. Application Data

(60) Provisional application No. 63/057,349, filed on Jul. 28, 2020, provisional application No. 63/057,345,
(Continued)

(51) Int. Cl.
*H01Q 1/38* (2006.01)
*H05K 1/03* (2006.01)
(Continued)

(52) U.S. Cl.
CPC ........... *H05K 1/0373* (2013.01); *H01Q 1/243* (2013.01); *H01Q 1/38* (2013.01); *H01Q 21/065* (2013.01);
(Continued)

(58) Field of Classification Search
CPC ... H05K 2203/072; H05K 2201/10098; H05K 2201/0263; H05K 2201/0209; H05K 2201/0154; H05K 2201/0145; H05K 2201/0141; H05K 2201/0129; H05K 3/182; H05K 3/0032; H05K 21/065; H05K 1/0373; H01Q 21/065; H01Q 1/243
See application file for complete search history.

(56) References Cited

U.S. PATENT DOCUMENTS 4,162,466 A    7/1979  Hunsinger et al.
4,458,039 A    7/1984  Eickman
(Continued)

FOREIGN PATENT DOCUMENTS

CN    104961916 A    10/2015
CN    104961922 A    10/2015
(Continued)

OTHER PUBLICATIONS

Article—Liu et al., "Immobilization and melting point depression of imidazolium ionic liquids on the surface of nano-SiO$_x$ particles," *Dalton Trans.*, vol. 39, 2010, pp. 3190-3194.
(Continued)

*Primary Examiner* — Graham P Smith
(74) *Attorney, Agent, or Firm* — Dority & Manning, P.A.

(57) ABSTRACT

A circuit structure that comprises a substrate and one or more conductive elements disposed on the substrate is provided. The substrate comprises a polymer composition that comprises an electrically conductive filler distributed within a polymer matrix. The polymer matrix contains at least one thermoplastic high performance polymer having a deflection temperature under load of about 40° C. or more as determined in accordance with ISO 75-2:2013 at a load of 1.8 MPa, and the polymer composition exhibits a dielectric constant of about 4 or more and a dissipation factor of about 0.3 or less, as determined at a frequency of 2 GHz.

38 Claims, 10 Drawing Sheets

Related U.S. Application Data filed on Jul. 28, 2020, provisional application No. 62/981,681, filed on Feb. 26, 2020, provisional application No. 62/981,667, filed on Feb. 26, 2020.

(51) Int. Cl.
| | |
|---|---|
| *H05K 3/00* | (2006.01) |
| *H05K 3/18* | (2006.01) |
| *H01Q 1/24* | (2006.01) |
| *H01Q 21/06* | (2006.01) |

(52) U.S. Cl.
CPC ......... *H05K 3/0032* (2013.01); *H05K 3/182* (2013.01); *H05K 2201/0129* (2013.01); *H05K 2201/0141* (2013.01); *H05K 2201/0145* (2013.01); *H05K 2201/0154* (2013.01); *H05K 2201/0209* (2013.01); *H05K 2201/0263* (2013.01); *H05K 2201/10098* (2013.01); *H05K 2203/072* (2013.01)

(56) References Cited

U.S. PATENT DOCUMENTS

| | | | |
|---|---|---|---|
| 4,943,606 A | 7/1990 | Inoue et al. |
| 4,960,654 A | 10/1990 | Yoshinaka et al. |
| 5,352,746 A | 10/1994 | Asai et al. |
| 5,375,403 A | 12/1994 | Capote et al. |
| 5,492,946 A | 2/1996 | Huspeni et al. |
| 5,508,374 A | 4/1996 | Lee et al. |
| 5,538,666 A | 7/1996 | Jin |
| 5,830,940 A | 11/1998 | Nakamura et al. |
| 5,847,039 A | 12/1998 | Nagashima et al. |
| 5,928,589 A | 7/1999 | Norota et al. |
| 5,962,122 A | 10/1999 | Walpita et al. |
| 5,997,765 A | 12/1999 | Furuta et al. |
| 6,010,760 A | 1/2000 | Miyazaki et al. |
| 6,046,300 A | 4/2000 | Umetsu et al. |
| 6,063,848 A | 5/2000 | Murakami et al. |
| 6,140,455 A | 10/2000 | Nagashima et al. |
| 6,153,121 A | 11/2000 | Makabe et al. |
| 6,303,524 B1 | 10/2001 | Sharangpani et al. |
| 6,346,864 B1 | 2/2002 | Kadota |
| 6,379,795 B1 | 4/2002 | Bisaria et al. |
| 6,492,463 B1 | 12/2002 | Waggoner |
| 6,495,616 B2 | 12/2002 | Maeda |
| 6,613,847 B2 | 9/2003 | Soelch |
| 6,641,928 B2 | 11/2003 | Takeichi et al. |
| 6,680,002 B2 | 1/2004 | Yamauchi et al. |
| 6,702,955 B1 | 3/2004 | Murakami et al. |
| 6,702,956 B2 | 3/2004 | Maeda et al. |
| 6,733,691 B2 | 5/2004 | Nagano et al. |
| 6,755,992 B2 | 6/2004 | Okamoto et al. |
| 6,758,989 B2 | 7/2004 | Miyashita et al. |
| 6,797,198 B1 | 9/2004 | Miyashita et al. |
| 6,818,821 B2 | 11/2004 | Fujieda et al. |
| 6,833,405 B1 | 12/2004 | Cottis |
| 6,861,463 B2 | 3/2005 | Cottis |
| 7,079,405 B2 | 7/2006 | Tobita et al. |
| 7,166,238 B2 | 1/2007 | Kato et al. |
| 7,175,779 B1 | 2/2007 | Kricheldorf et al. |
| 7,180,172 B2 | 2/2007 | Sethumadhaven et al. |
| 7,189,778 B2 | 3/2007 | Tobita et al. |
| 7,223,807 B2 | 5/2007 | Okamoto et al. |
| 7,239,261 B2 | 7/2007 | Fujieda et al. |
| 7,247,590 B2 | 7/2007 | Kawabata et al. |
| 7,251,405 B2 | 7/2007 | Shelnut et al. |
| 7,276,284 B2 | 10/2007 | Frohs |
| 7,344,657 B2 | 3/2008 | Okamoto et al. |
| 7,438,832 B2 | 10/2008 | Majumdar et al. |
| 7,455,901 B2 | 11/2008 | Yano et al. |
| 7,504,150 B2 | 3/2009 | Lee et al. |
| 7,531,204 B2 | 5/2009 | Lee et al. |
| 7,540,991 B2 | 6/2009 | Shimoyama et al. |
| 7,547,403 B2 | 6/2009 | Miyashita et al. |
| 7,547,849 B2 | 6/2009 | Lee et al. |
| 7,583,226 B2 | 9/2009 | Sakurada |
| 7,601,771 B2 | 10/2009 | Schmidt et al. |
| 7,618,553 B2 | 11/2009 | Kim et al. |
| 7,641,833 B2 | 1/2010 | Aoki et al. |
| 7,648,748 B2 | 1/2010 | Nakane et al. |
| 7,648,758 B2 | 1/2010 | Morin |
| 7,704,408 B2 | 4/2010 | Fukatsu |
| 7,713,439 B2 | 5/2010 | Murouchi et al. |
| 7,737,198 B2 | 6/2010 | Murouchi et al. |
| 7,740,770 B2 | 6/2010 | Mizumoto et al. |
| 7,789,670 B2 | 9/2010 | Fukatsu et al. |
| 7,824,572 B2 | 11/2010 | Okamoto |
| 7,825,176 B2 | 11/2010 | Kim et al. |
| 7,892,450 B2 | 2/2011 | Uchida et al. |
| 7,931,824 B2 | 4/2011 | Gin et al. |
| 7,980,897 B2 | 7/2011 | Fukatsu et al. |
| 7,985,351 B2 | 7/2011 | Yamauchi et al. |
| 8,012,352 B1 | 9/2011 | Giraldo et al. |
| 8,025,814 B2 | 9/2011 | Uehara et al. |
| 8,029,694 B2 | 10/2011 | Saga |
| 8,066,907 B2 | 11/2011 | Kohinata et al. |
| 8,142,683 B2 | 3/2012 | Murouchi et al. |
| 8,192,645 B2 | 6/2012 | Murouchi et al. |
| 8,202,448 B2 | 6/2012 | Fukuhara et al. |
| 8,222,802 B2 | 7/2012 | Saito et al. |
| 8,231,805 B2 | 7/2012 | Fukuhara et al. |
| 8,231,807 B2 | 7/2012 | Yonezawa et al. |
| 8,272,879 B2 | 9/2012 | Fukatsu et al. |
| 8,309,640 B2 | 11/2012 | Li et al. |
| 8,324,307 B2 | 12/2012 | Harder et al. |
| 8,337,719 B2 | 12/2012 | Hosoda et al. |
| 8,425,798 B2 | 4/2013 | Saito et al. |
| 8,432,484 B2 | 4/2013 | Christison |
| 8,440,780 B2 | 5/2013 | Hamaguchi et al. |
| 8,465,670 B2 | 6/2013 | Kondo et al. |
| 8,475,924 B2 | 7/2013 | Lee et al. |
| 8,492,464 B2 | 7/2013 | Li et al. |
| 8,545,718 B2 | 10/2013 | Nakayama et al. |
| 8,545,719 B2 | 10/2013 | Komatsu et al. |
| 8,580,145 B2 | 11/2013 | Osato et al. |
| 8,642,682 B2 | 2/2014 | Nishihata |
| 8,646,994 B2 | 2/2014 | Kim et al. |
| 8,658,057 B2 | 2/2014 | Nakayama et al. |
| 8,692,272 B2 | 4/2014 | Matsumi et al. |
| 8,696,932 B2 | 4/2014 | Uchida et al. |
| 8,697,817 B2 | 4/2014 | Waggoner et al. |
| 8,715,526 B2 | 5/2014 | Kitai et al. |
| 8,778,220 B2 | 7/2014 | Lee et al. |
| 8,778,222 B2 | 7/2014 | Matsubara et al. |
| 8,778,247 B2 | 7/2014 | Stoeks et al. |
| 8,784,683 B2 | 7/2014 | Matsubara et al. |
| 8,816,019 B2 | 8/2014 | Ganguly et al. |
| 8,834,741 B2 | 9/2014 | Shiraishi et al. |
| 8,841,367 B2 | 9/2014 | Zheng et al. |
| 8,883,900 B2 | 11/2014 | Jiang et al. |
| 8,895,649 B2 | 11/2014 | Li et al. |
| 8,906,259 B2 | 12/2014 | Kim |
| 8,926,862 B2 | 1/2015 | Kim et al. |
| 8,927,661 B2 | 1/2015 | Li et al. |
| 8,932,483 B2 | 1/2015 | Kim |
| 8,946,333 B2 | 2/2015 | Raman et al. |
| 8,980,986 B2 | 3/2015 | Lee et al. |
| 8,992,805 B2 | 3/2015 | Nishimura et al. |
| 9,018,286 B2 | 4/2015 | Daga et al. |
| 9,018,315 B2 | 4/2015 | Waggoner et al. |
| 9,023,923 B2 | 5/2015 | An et al. |
| 9,045,621 B2 | 6/2015 | Matsubara et al. |
| 9,045,685 B2 | 6/2015 | Nair et al. |
| 9,051,514 B2 | 6/2015 | Nair et al. |
| 9,074,070 B2 | 7/2015 | Yung et al. |
| 9,096,794 B2 | 8/2015 | Nair et al. |
| 9,103,020 B2 | 8/2015 | Gong et al. |
| 9,109,111 B2 | 8/2015 | Lee et al. |
| 9,185,800 B2 | 11/2015 | Meng et al. |
| 9,234,092 B2 | 1/2016 | Nakayama et al. |
| 9,258,892 B2 | 2/2016 | Crosley |
| 9,283,707 B2 | 3/2016 | Saito et al. |
| 9,284,435 B2 | 3/2016 | Kim |

(56) References Cited

U.S. PATENT DOCUMENTS

| | | |
|---|---|---|
| 9,355,753 B2 | 5/2016 | Kim |
| 9,394,483 B2 | 7/2016 | Wu et al. |
| 9,512,293 B2 | 12/2016 | Kim |
| 9,538,646 B2 | 1/2017 | Onodera et al. |
| 9,574,065 B2 | 2/2017 | Miyamoto et al. |
| 9,822,254 B2 | 11/2017 | Kim |
| 9,896,566 B2 | 2/2018 | Yung et al. |
| 9,944,768 B2 | 4/2018 | Cheng et al. |
| 9,982,113 B2 | 5/2018 | Kniess et al. |
| 9,988,519 B2 | 6/2018 | Kim |
| 10,106,682 B2 | 10/2018 | Kim |
| 10,119,021 B2 | 11/2018 | Li et al. |
| 10,150,863 B2 | 12/2018 | Wu et al. |
| 10,174,180 B2 | 1/2019 | Bao et al. |
| 10,233,301 B2 | 3/2019 | Kato et al. |
| 10,273,362 B2 | 4/2019 | Zhang et al. |
| 10,280,282 B2 | 5/2019 | Kim |
| 10,280,332 B2 | 5/2019 | Moussa et al. |
| 10,290,389 B2 | 5/2019 | Wu et al. |
| 10,329,422 B2 | 6/2019 | Li et al. |
| 10,433,428 B2 | 10/2019 | Spiegel et al. |
| 10,604,649 B2 | 3/2020 | Yamanaka |
| 10,667,407 B2 | 5/2020 | Spiegel et al. |
| 10,697,065 B2 | 6/2020 | Hua et al. |
| 10,714,810 B2 | 7/2020 | Hong et al. |
| 10,741,932 B2 | 8/2020 | Thai et al. |
| 10,767,049 B2 | 9/2020 | Kim |
| 10,784,030 B2 | 9/2020 | Lee et al. |
| 10,822,452 B2 | 11/2020 | Tsuchiya et al. |
| 10,822,453 B2 | 11/2020 | Washino |
| 10,829,634 B2 | 11/2020 | Kim |
| 10,899,900 B2 | 1/2021 | Jung et al. |
| 10,941,275 B2 | 3/2021 | Kim |
| 10,968,311 B2 | 4/2021 | Washino |
| 11,028,250 B2 | 6/2021 | Zhang et al. |
| 11,075,442 B2 | 7/2021 | Wang et al. |
| 11,136,445 B2 | 10/2021 | Kim |
| 11,258,184 B2 | 2/2022 | Kim et al. |
| 2002/0064701 A1 | 5/2002 | Hand et al. |
| 2002/0190432 A1 | 12/2002 | Shiwaku et al. |
| 2004/0165390 A1 | 8/2004 | Sato et al. |
| 2005/0077498 A1 | 4/2005 | Kato et al. |
| 2005/0130447 A1 | 6/2005 | Takaya et al. |
| 2005/0176835 A1 | 8/2005 | Kobayashi et al. |
| 2005/0191877 A1 | 9/2005 | Huang |
| 2005/0260361 A1 | 11/2005 | Alms et al. |
| 2006/0009580 A1 | 1/2006 | Alms et al. |
| 2006/0014876 A1 | 1/2006 | Bushelman et al. |
| 2006/0025561 A1 | 2/2006 | Watanabe et al. |
| 2007/0057236 A1 | 3/2007 | Hosoda et al. |
| 2007/0190346 A1 | 8/2007 | Ikegawa |
| 2009/0027586 A1 | 1/2009 | Kumai et al. |
| 2009/0212684 A1 | 8/2009 | Saito et al. |
| 2010/0012354 A1 | 1/2010 | Hedin et al. |
| 2010/0051999 A1 | 3/2010 | Iwase et al. |
| 2010/0053972 A1 | 3/2010 | Nakayama |
| 2010/0263919 A1 | 10/2010 | Lee et al. |
| 2010/0327728 A1 | 12/2010 | Saito et al. |
| 2011/0171452 A1 | 7/2011 | Öttinger et al. |
| 2011/0189454 A1 | 8/2011 | Fukuhara et al. |
| 2012/0040128 A1 | 2/2012 | Finn |
| 2012/0135228 A1 | 5/2012 | Fukuhara et al. |
| 2012/0199790 A1 | 8/2012 | Yun et al. |
| 2012/0276390 A1 | 11/2012 | Ji et al. |
| 2013/0015411 A1 | 1/2013 | Kang et al. |
| 2013/0052447 A1 | 2/2013 | Grenci et al. |
| 2013/0123420 A1 | 5/2013 | Kim |
| 2013/0200297 A1 | 8/2013 | Saga |
| 2014/0060899 A1 | 3/2014 | Park et al. |
| 2014/0128545 A1 | 5/2014 | Xiong et al. |
| 2014/0142571 A1 | 5/2014 | Yung et al. |
| 2014/0159285 A1 | 6/2014 | Choi |
| 2014/0171567 A1 | 6/2014 | Guo et al. |
| 2014/0296411 A1 | 10/2014 | Cheng et al. |
| 2014/0353543 A1 | 12/2014 | Wu et al. |
| 2015/0175805 A1 | 6/2015 | Schaefer |
| 2015/0274965 A1 | 10/2015 | Nair et al. |
| 2015/0337132 A1 | 11/2015 | Van der Burgt |
| 2016/0116948 A1 | 4/2016 | Ou et al. |
| 2016/0301141 A1 | 10/2016 | Del Castillo et al. |
| 2017/0002193 A1 | 1/2017 | Cheng et al. |
| 2017/0273179 A1 | 9/2017 | Kim |
| 2017/0361584 A1 | 12/2017 | Feng et al. |
| 2017/0362731 A1 | 12/2017 | Wang et al. |
| 2017/0367182 A1 | 12/2017 | Wu et al. |
| 2018/0215894 A1 | 8/2018 | Cheng et al. |
| 2018/0230294 A1 | 8/2018 | Cheng et al. |
| 2018/0332710 A1 | 11/2018 | Lin et al. |
| 2018/0346711 A1 | 12/2018 | Van der Burgt et al. |
| 2018/0362758 A1 | 12/2018 | Wu et al. |
| 2019/0027813 A1 | 1/2019 | Wang |
| 2019/0031879 A1 | 1/2019 | Ding et al. |
| 2019/0153216 A1 | 5/2019 | Gong et al. |
| 2019/0237851 A1 | 8/2019 | Gu |
| 2019/0269012 A1 | 8/2019 | Van der Burgt |
| 2019/0322861 A1 | 10/2019 | Wei et al. |
| 2019/0341696 A1 | 11/2019 | O'Connor et al. |
| 2019/0352501 A1 | 11/2019 | Wang et al. |
| 2019/0352503 A1 | 11/2019 | Cheng et al. |
| 2020/0017769 A1 | 1/2020 | Konno et al. |
| 2020/0022264 A1 | 1/2020 | Cheng et al. |
| 2020/0040133 A1 | 2/2020 | Washino |
| 2020/0076035 A1 | 3/2020 | Huh et al. |
| 2020/0091608 A1 | 3/2020 | Alpman et al. |
| 2020/0219861 A1 | 7/2020 | Kamgaing et al. |
| 2020/0299582 A1 | 9/2020 | Komatsu |
| 2020/0347303 A1 | 11/2020 | Pan et al. |
| 2020/0369884 A1 | 11/2020 | Lee et al. |
| 2021/0024701 A1 | 1/2021 | Wang et al. |
| 2021/0054190 A1 | 2/2021 | Kim |
| 2021/0057811 A1 | 2/2021 | Kim |
| 2021/0057827 A1 | 2/2021 | Kim et al. |
| 2021/0061994 A1 | 3/2021 | Kim |
| 2021/0070927 A1 | 3/2021 | Zhang et al. |
| 2021/0070929 A1 | 3/2021 | Kim et al. |
| 2021/0070983 A1 | 3/2021 | Kim et al. |
| 2021/0075093 A1 | 3/2021 | Zhang et al. |
| 2021/0075162 A1 | 3/2021 | Kim et al. |
| 2021/0091818 A1 | 3/2021 | Zhang et al. |
| 2021/0092836 A1 | 3/2021 | Zhang et al. |
| 2021/0130585 A1 | 5/2021 | Wang et al. |
| 2021/0130604 A1 | 5/2021 | Ramakrishnan et al. |
| 2021/0143539 A1 | 5/2021 | Yuan et al. |
| 2021/0189095 A1 | 6/2021 | Kim |
| 2021/0261755 A1 | 8/2021 | Kim |
| 2021/0261771 A1 | 8/2021 | Kim |
| 2021/0265075 A1 | 8/2021 | Kim |
| 2021/0269588 A1 | 9/2021 | Washino |
| 2022/0025153 A1 | 1/2022 | Kim |
| 2022/0037050 A1 | 2/2022 | Kim |
| 2022/0127499 A1 | 4/2022 | Kim |
| 2022/0149541 A1 | 5/2022 | Kim et al. |

FOREIGN PATENT DOCUMENTS

| | | |
|---|---|---|
| CN | 105542408 A | 5/2016 |
| CN | 106633680 A | 5/2017 |
| CN | 107022171 A | 8/2017 |
| CN | 105623206 B | 12/2017 |
| CN | 108045022 A | 5/2018 |
| CN | 108102314 A | 6/2018 |
| CN | 108178906 A | 6/2018 |
| CN | 108250692 A | 7/2018 |
| CN | 207772540 U | 8/2018 |
| CN | 108148433 A | 12/2018 |
| CN | 109301507 A | 2/2019 |
| CN | 109467643 A | 3/2019 |
| CN | 109467722 A | 3/2019 |
| CN | 109509975 A | 3/2019 |
| CN | 208675597 U | 3/2019 |
| CN | 106633860 B | 4/2019 |
| CN | 109735060 A | 5/2019 |
| CN | 109742534 A | 5/2019 |
| CN | 109755729 A | 5/2019 |

(56) References Cited

FOREIGN PATENT DOCUMENTS

| | | |
|---|---|---|
| CN | 109755733 A | 5/2019 |
| CN | 109790361 A | 5/2019 |
| CN | 208904227 U | 5/2019 |
| CN | 110154464 A | 8/2019 |
| CN | 209266563 U | 8/2019 |
| CN | 209266570 U | 8/2019 |
| CN | 209266571 U | 8/2019 |
| CN | 209516005 U | 10/2019 |
| CN | 209544599 U | 10/2019 |
| CN | 110505753 A | 11/2019 |
| CN | 110746754 A | 2/2020 |
| CN | 110769594 A | 2/2020 |
| CN | 110903612 A | 3/2020 |
| CN | 111087797 A | 5/2020 |
| CN | 111117169 A | 5/2020 |
| CN | 210706390 U | 6/2020 |
| EP | 0 312 331 A2 | 4/1989 |
| EP | 0 312 331 A3 | 4/1989 |
| EP | 1 116 769 A2 | 7/2001 |
| EP | 1 116 769 A3 | 7/2001 |
| EP | 1 382 437 A2 | 1/2004 |
| EP | 1 382 437 A3 | 1/2004 |
| EP | 1 699 228 A1 | 9/2006 |
| EP | 2 774 952 B1 | 9/2014 |
| EP | 2 981 573 B1 | 6/2018 |
| EP | 3 674 080 A1 | 7/2020 |
| EP | 3 674 368 A1 | 7/2020 |
| EP | 3 730 545 A1 | 10/2020 |
| JP | H 0481451 A | 3/1992 |
| JP | H 05140282 A | 6/1993 |
| JP | H 0718162 A | 1/1995 |
| JP | H 09143347 A | 6/1997 |
| JP | H 09297256 A | 11/1997 |
| JP | H 1160927 A | 3/1999 |
| JP | H 1180517 A | 3/1999 |
| JP | H 1180518 A | 3/1999 |
| JP | H 11147999 A | 6/1999 |
| JP | 2000080289 A | 3/2000 |
| JP | 2000273292 A | 10/2000 |
| JP | 2000273320 A | 10/2000 |
| JP | 2000281885 A | 10/2000 |
| JP | 2003268089 A | 9/2003 |
| JP | 2003268241 A | 9/2003 |
| JP | 2004182895 A | 7/2004 |
| JP | 2004263162 A | 9/2004 |
| JP | 2004277539 A | 10/2004 |
| JP | 2005078806 A | 3/2005 |
| JP | 2005187696 A | 7/2005 |
| JP | 4945097 B2 | 1/2007 |
| JP | 2007273537 A | 10/2007 |
| JP | 2008075079 A | 4/2008 |
| JP | 2008214573 A | 9/2008 |
| JP | 2009155436 A | 7/2009 |
| JP | 2009242454 A | 10/2009 |
| JP | 2009242455 A | 10/2009 |
| JP | 2010254875 A | 11/2010 |
| JP | 2011052037 A | 3/2011 |
| JP | 5172279 B2 | 3/2013 |
| JP | 5280281 B2 | 9/2013 |
| JP | 5332081 B2 | 11/2013 |
| JP | 5866423 B2 | 2/2016 |
| JP | 2016041828 A | 3/2016 |
| JP | 5919613 B2 | 5/2016 |
| JP | 5924527 B2 | 5/2016 |
| JP | 2017119378 A | 7/2017 |
| JP | 2017120826 A | 7/2017 |
| JP | 6181587 B2 | 8/2017 |
| JP | 2018016753 A | 2/2018 |
| JP | 2018016754 A | 2/2018 |
| JP | 6295013 B2 | 3/2018 |
| JP | 6359225 B2 | 7/2018 |
| JP | 2018109090 A | 7/2018 |
| JP | 6405817 B2 | 10/2018 |
| JP | 6405818 B2 | 10/2018 |
| JP | 2019006973 A | 1/2019 |
| JP | 6470295 B2 | 2/2019 |
| JP | 2019065263 A | 4/2019 |
| JP | 2019099618 A | 6/2019 |
| JP | 2019106434 A | 6/2019 |
| JP | 2019116586 A | 7/2019 |
| JP | 2019127556 A | 8/2019 |
| JP | 2019127557 A | 8/2019 |
| JP | 6576754 B2 | 9/2019 |
| JP | 6576808 B2 | 9/2019 |
| JP | 2019189734 A | 10/2019 |
| JP | 2019189735 A | 10/2019 |
| JP | 2019189736 A | 10/2019 |
| JP | 2019189737 A | 10/2019 |
| JP | 6773824 B2 | 10/2020 |
| KR | 20120114048 A | 10/2012 |
| KR | 20130047456 A | 5/2013 |
| KR | 102104752 B1 | 4/2020 |
| KR | 102104753 B1 | 4/2020 |
| KR | 20200070501 A | 6/2020 |
| KR | 102167337 B1 | 10/2020 |
| WO | WO 2005/063889 A1 | 7/2005 |
| WO | WO 2006/104701 A1 | 10/2006 |
| WO | WO 2006/126861 A1 | 11/2006 |
| WO | WO 2009/005317 A2 | 1/2009 |
| WO | WO 2009/005317 A3 | 1/2009 |
| WO | WO 2010/013578 A1 | 2/2010 |
| WO | WO 2012/050082 A1 | 4/2012 |
| WO | WO 2013/032970 A1 | 3/2013 |
| WO | WO 2013/066003 A | 5/2013 |
| WO | WO 2013/074469 A1 | 5/2013 |
| WO | WO 2013/074475 A1 | 5/2013 |
| WO | WO 2013/129338 A1 | 9/2013 |
| WO | WO 2014/162254 A1 | 10/2014 |
| WO | WO 2014/180550 A1 | 11/2014 |
| WO | WO 2014/203227 A2 | 12/2014 |
| WO | WO 2016/003588 A1 | 1/2016 |
| WO | WO 2016/209792 A1 | 12/2016 |
| WO | WO 2017/004064 A1 | 1/2017 |
| WO | WO 2017/029608 A1 | 2/2017 |
| WO | WO 2018/026601 A1 | 2/2018 |
| WO | WO 2018/056294 A1 | 3/2018 |
| WO | WO 2018/141769 A1 | 8/2018 |
| WO | WO 2019/042906 A1 | 3/2019 |
| WO | WO 2019/213920 A1 | 11/2019 |
| WO | WO 2020/194196 A1 | 10/2020 |
| WO | WO 2020/217225 A1 | 10/2020 |

OTHER PUBLICATIONS

Article—Möhwald et al., "Laser Beam Activation of CNT-Filled Polymer Blends," *Laser Technik Journal*, Feb. 2015, pp. 52-55 (© 2015 Wiley-VCH Verlag GmbH & Co. KGaA, Weinheim).
Article—Zaderej et al., "ASEP (Application Specific Electronics Package) A Next Generation Electronics Manufacturing Technology," Proceedings of SMTA International, 2018, 8 pages.
Product and Property Guide for DuPont™ Zenite® LCP liquid crystal polymer resin, May 2006, 33 pages.
Product Information—Sigrafil® C, the Carbon Fiber for Thermoplastic Compounds from SGL Group, 2009, 4 pages.
Product Information on Talc from Nippon Talc Co., Ltd., 5 pages.
Related Application Form.
Search Report and Written Opinion for PCT/US2021/018471 dated May 5, 2021, 9 pages.
Amato, Ing. Francesco, Ph.D., "A Primer on 5G," Jan. 11, 2019, 19 pages.
Bjornson, Emil, "Massive MIMO for 5G," Tutorial at 2015 IEEE International Workshop on Signal Processing Advances in Wireless Communications, (SPAWC), Jun. 29, Stockholm, Sweden 58 pages.
Hassan et al., Massive MIMO Wireless Networks: An Overview, *Electronics*, 2017, 6, 63, pp. 1-29.
Jilani et al., "Millimeter-wave Liquid Crystal Polymer Based Antenna Array for Conformal 5G Applications," *IEEE Antennas and Wireless Propagation Letters*, vol. 18, Issue 1, Jan. 2019, pp. 84-88.
Paper—The Fifth Generation of Wireless Network Communications from TE Connectivity, Apr. 2019, 20 pages.

(56) References Cited

OTHER PUBLICATIONS

Paper—Material Solutions for 5G Applications from Sabic, 2018, 4 pages.
Takata, et al., "Electrical properties and practical applications of Liquid Crystal Polymer flex," *IEEE Polytronic 2007 Conference*, pp. 67-72.
Technical Article—Plastic Materials—Liquid Crystal Polymers from Steinwall Plastic Injection Molding, May 2016, 3 pages.
Theil et al., "The Effect of Thermal Cycling on a-C:F,H Low Dielectric Constant Films Deposited by ECR Plasma Enhanced Chemical Vapor Deposition," *Proceedings for the International Interconnect Technology Conference*, Jun. 1998, p. 128-131, 3 pages.
International Search Report and Written Opinion for PCT/US2021/018486 dated Jun. 15, 2021, 14 pages.

CIRCUIT STRUCTURE

CROSS REFERENCE TO RELATED APPLICATIONS

The present application claims filing benefit of United States Provisional Patent Application Serial Nos. 62/981,667 (filing date of Feb. 26, 2020), 62/981,681 (filing date of Feb. 26, 2020), 63/057,345 (filing date of Jul. 28, 2020), and 63/057,349 (filing date of Jul. 28, 2020), which are incorporated herein by reference in their entirety.

BACKGROUND OF THE INVENTION

Molded interconnect devices ("MIDs") are three-dimensional electromechanical parts that typically include plastic components and electronic circuit traces. A plastic substrate is created and electrical circuits and devices are plated, layered or implanted upon the plastic substrate. MIDs typically have fewer parts than conventionally produced devices, which results in space and weight savings. Current processes for manufacturing MIDs include two-shot molding and laser direct structuring. Laser direct structuring, for instance, involves the use of spinel crystals (e.g., copper chromite) that act as a seed for initiating metallization of the substrate. After the metal layer is formed, a laser etches a wiring pattern onto the part and prepares it for metallization. Despite its benefits, one of the limitations of laser direct structured materials is that the spinel crystals tend to adversely impact the performance of the composition at the high frequencies often encountered in antenna systems. As such, a need currently exists for an improved polymer substrate that can be plated and yet retain good performance at high frequency ranges.

SUMMARY OF THE INVENTION

In accordance with one embodiment of the present invention, a circuit structure is disclosed that comprises a substrate and one or more conductive elements disposed on the substrate. The substrate comprises a polymer composition that comprises an electrically conductive filler distributed within a polymer matrix. The polymer matrix contains at least one thermoplastic high performance polymer having a deflection under load of about 40° C. or more as determined in accordance with ISO 75-2:2013 at a load of 1.8 MPa, and the polymer composition exhibits a dielectric constant of about 4 or more and a dissipation factor of about 0.3 or less, as determined at a frequency of 2 GHz.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
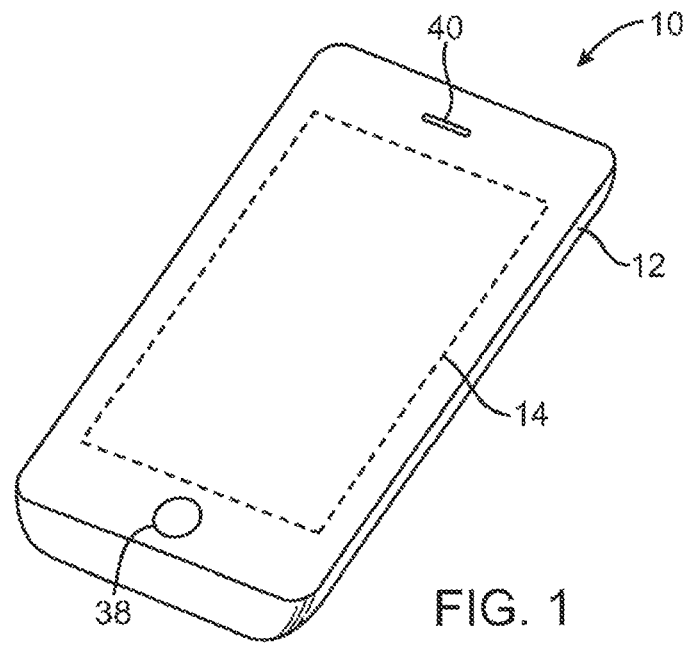
FIGS. 1-2 are respective front and rear perspective views of one embodiment of an electronic component that can employ an antenna system.

It is to be understood by one of ordinary skill in the art that the present discussion is a description of exemplary embodiments only, and is not intended as limiting the broader aspects of the present invention.

Generally speaking, the present invention is directed to a circuit structure that contains a substrate and one or more conductive elements disposed thereon. The substrate contains a polymer composition that includes an electrically conductive filler, which is distributed within a polymer matrix that includes a high performance thermoplastic polymer. By selectively controlling various aspects of the composition, the present inventor has discovered that the resulting composition is able to maintain a unique combination of a high dielectric constant and low dissipation factor for use in various types of electronic components, such as an antenna system. For example, the polymer composition may exhibit a high dielectric constant of about 4 or more, in some embodiments about 5 or more, in some embodiments about 6 or more, in some embodiments from about 8 to about 30, in some embodiments from about 10 to about 25, and in some embodiments, from about 12 to about 24, as determined by the split post resonator method at a frequency of 2 GHz. Such a high dielectric constant can facilitate the ability to form a thin substrate and also allow multiple conductive elements (e.g., antennae) to be employed that operate simultaneously with only a minimal level of electrical interference. The dissipation factor, a measure of the loss rate of energy, may also be relatively low, such as about 0.3 or less, in some embodiments about 0.2 or less, in some embodiments about 0.1 or less, in some embodiments about 0.06 or less, in some embodiments about 0.04 or less, and in some embodiments, from about 0.001 to about 0.03, as determined by the split post resonator method at a frequency of 2 GHz. The present inventor has also discovered that the dielectric constant and dissipation factor can be maintained within the ranges noted above even when exposed to various temperatures, such as a temperature of from about −30° C. to about 100° C. For example, when subjected to a heat cycle test as described herein, the ratio of the dielectric constant after heat cycling to the initial dielectric constant may be about 0.8 or more, in some embodiments about 0.9 or more, and in some embodiments, from about 0.95 to about 1.1. Likewise, the ratio of the dissipation factor after being exposed to the high temperature to the initial dissipation factor may be about 1.3 or less, in some embodiments about 1.2 or less, in some embodiments about 1.1 or less, in some embodiments about 1.0 or less, in some embodiments about 0.95 or less, in some embodiments from about 0.1 to about 0.95, and in some embodiments, from about 0.2 to about 0.9. The change in dissipation factor (i.e., the initial dissipation factor—the dissipation factor after heat cycling) may also range from about −0.1 to about 0.1, in some embodiments from about −0.05 to about 0.01, and in some embodiments, from about −0.001 to 0.

Conventionally, it was believed that polymer compositions that possess the combination of a high dielectric constant and low dissipation factor would not also possess a high enough electrical conductivity to allow for metallization of the substrate. The present inventor has discovered, however, that the polymer composition may exhibit a controlled resistivity that allows it to remain generally antistatic in nature such that a substantial amount of electrical current does not flow through the part, but nevertheless exhibits a sufficient degree of electrostatic dissipation to facilitate plating and formation of conductive traces thereon. The surface resistivity may, for instance, range from about $1 \times 10^{12}$ ohms to about $1 \times 10^{18}$ ohms, in some embodiments from about $1 \times 10^{13}$ ohms to about $1 \times 10^{18}$ ohms, in some embodiments from about $1 \times 10^{14}$ ohms to about $1 \times 10^{17}$ ohms, and in some embodiments, from about $1 \times 10^{15}$ ohms to about $1 \times 10^{17}$ ohms, such as determined in accordance with ASTM D257-14 (technically equivalent to IEC 62631-3-1). Likewise, the composition may also exhibit a volume resistivity of from about $1 \times 10^{10}$ ohm-m to about $1 \times 10^{16}$ ohm-m, in some embodiments from about $1 \times 10^{11}$ ohm-m to about $1 \times 10^{16}$ ohm-m, in some embodiments from about $1 \times 10^{12}$ ohm-m to about $1 \times 10^{15}$ ohm-m, and in some embodiments, from about $1 \times 10^{13}$ ohm-m to about $1 \times 10^{15}$ ohm-m, such as determined at a temperature of about 20° C. in accordance with ASTM D257-14 (technically equivalent to IEC 62631-3-1).

The polymer composition of the present invention may also possess excellent strength properties. For example, the composition may exhibit a Charpy unnotched and/or notched impact strength of about 2 kJ/m², in some embodiments from about 4 to about 40 kJ/m², and in some embodiments, from about 6 to about 30 kJ/m², measured at 23° C. according to ISO Test No. 179-1:2010. The composition may also exhibit a tensile strength of from about 20 to about 500 MPa, in some embodiments from about 50 to about 400 MPa, and in some embodiments, from about 60 to about 350 MPa; tensile break strain of about 0.5% or more, in some embodiments from about 0.8% to about 15%, and in some embodiments, from about 1% to about 10%; and/or tensile modulus of from about 5,000 MPa to about 30,000 MPa, in some embodiments from about 7,000 MPa to about 25,000 MPa, and in some embodiments, from about 10,000 MPa to about 20,000 MPa. The tensile properties may be determined in accordance with ISO Test No. 527:2019 at 23° C. The composition may also exhibit a flexural strength of from about 40 to about 500 MPa, in some embodiments from about 50 to about 400 MPa, and in some embodiments, from about 100 to about 350 MPa; flexural break strain of about 0.5% or more, in some embodiments from about 0.8% to about 15%, and in some embodiments, from about 1% to about 10%; and/or flexural modulus of about 7,000 MPa or more, in some embodiments from about 9,000 MPa or more, in some embodiments, from about 10,000 MPa to about 30,000 MPa, and in some embodiments, from about 12,000 MPa to about 25,000 MPa. The flexural properties may be determined in accordance with ISO Test No. 178:2019 at 23° C.

As indicated above, one benefit of the present invention is that a substrate formed from the polymer composition can be readily plated without the use of conventional laser activatable spinel crystals, which generally have the formula, $AB_2O_4$, wherein A is a metal cation having a valance of 2 (e.g., cadmium, chromium, manganese, nickel, zinc, copper, cobalt, iron, magnesium, tin, or titanium) and B is a metal cation having a valance of 3 (e.g., chromium, iron, aluminum, nickel, manganese, or tin). Typically, A in the formula above provides the primary cation component of a first metal oxide cluster and B provides the primary cation component of a second metal oxide cluster. For example, the first metal oxide cluster generally has a tetrahedral structure and the second metal oxide cluster generally has an octahedral cluster. Particular examples of such spinel crystals include, for instance, $MgAl_2O_4$, $ZnAl_2O_4$, $FeAl_2O_4$, $CuFe_2O_4$, $CuCr_2O_4$, $MnFe_2O_4$, $NiFe_2O_4$, $TiFe_2O_4$, $FeCr_2O_4$, or $MgCr_2O_4$. The polymer composition may be free of such spinel crystals (i.e., 0 wt. %), or such crystals may be present in only a small concentration, such as in an amount of about 1 wt. % or less, in some embodiments about 0.5 wt. % or less, and in some embodiments, from about 0.001 wt. % to about 0.2 wt. %.

Various embodiments of the present invention will now be described in more detail.

I. Polymer Composition

A. Polymer Matrix

The polymer matrix generally contains one or more thermoplastic high performance polymers, generally in an amount of from about 30 wt. % to about 80 wt. %, in some embodiments from about 40 wt. % to about 75 wt. %, and in some embodiments, from about 50 wt. % to about 70 wt. % of the entire polymer composition. The high performance polymers may have a high degree of heat resistance, such as reflected by a deflection temperature under load ("DTUL") of about 40° C. or more, in some embodiments about 50° C. or more, in some embodiments about 60° C. or more, in some embodiments from about from about 100° C. to about 320° C., in some embodiments from about 150° C. to about 310° C., and in some embodiments, from about 220° C. to about 300° C., as determined in accordance with ISO 75-2:2013 at a load of 1.8 MPa. In addition to exhibiting a high degree of heat resistance, the polymers also typically have a high glass transition temperature, such as about 40° C. or more, in some embodiments about 50° C. or more, in some embodiments about 60° C. or more, in some embodiments about 70° C. or more, in some embodiments about 80° C. or more, and in some embodiments, from about 100° C.

to about 320° C. When semi-crystalline or crystalline polymers are employed, the high performance polymers may also have a high melting temperature, such as about 140° C. or more, in some embodiments from about 150° C. to about 420° C., and in some embodiments, in some embodiments from about 200° C. to about 410° C., and in some embodiments, from about 300° C. to about 400° C. The glass transition and melting temperatures may be determined as is well known in the art using differential scanning calorimetry ("DSC"), such as determined by ISO 11357-2:2020 (glass transition) and 11357-3:2018 (melting).

Suitable high performance, thermoplastic polymers for this purpose may include, for instance, polyamides (e.g., aliphatic, semi-aromatic, or aromatic polyamides), polyesters, polyarylene sulfides, liquid crystalline polymers (e.g., wholly aromatic polyesters, polyesteramides, etc.), polycarbonates, polyphenylene ethers, polyphenylene oxides, polyimides (e.g., polyetherimide), etc., as well as blends thereof. The exact choice of the polymer system will depend upon a variety of factors, such as the nature of other fillers included within the composition, the manner in which the composition is formed and/or processed, and the specific requirements of the intended application.

Aromatic polymers, for instance, are particularly suitable for use in the polymer matrix. The aromatic polymers can be substantially amorphous, semi-crystalline, or crystalline in nature. One example of a suitable semi-crystalline aromatic polymer, for instance, is an aromatic polyester, which may be a condensation product of at least one diol (e.g., aliphatic and/or cycloaliphatic) with at least one aromatic dicarboxylic acid, such as those having from 4 to 20 carbon atoms, and in some embodiments, from 8 to 14 carbon atoms. Suitable diols may include, for instance, neopentyl glycol, cyclohexanedimethanol, 2,2-dimethyl-1,3-propane diol and aliphatic glycols of the formula $HO(CH_2)_nOH$ where n is an integer of 2 to 10. Suitable aromatic dicarboxylic acids may include, for instance, isophthalic acid, terephthalic acid, 1,2-di(p-carboxyphenyl)ethane, 4,4'-dicarboxydiphenyl ether, etc., as well as combinations thereof. Fused rings can also be present such as in 1,4- or 1,5- or 2,6-naphthalene-dicarboxylic acids. Particular examples of such aromatic polyesters may include, for instance, poly(ethylene terephthalate) (PET), poly(1,4-butylene terephthalate) (PBT), poly(1,3-propylene terephthalate) (PPT), poly(1,4-butylene 2,6-naphthalate) (PBN), poly(ethylene 2,6-naphthalate) (PEN), poly(1,4-cyclohexylene dimethylene terephthalate) (PCT), as well as mixtures of the foregoing.

Derivatives and/or copolymers of aromatic polyesters (e.g., polyethylene terephthalate) may also be employed. For instance, in one embodiment, a modifying acid and/or diol may be used to form a derivative of such polymers. As used herein, the terms "modifying acid" and "modifying diol" are meant to define compounds that can form part of the acid and diol repeat units of a polyester, respectively, and which can modify a polyester to reduce its crystallinity or render the polyester amorphous. Examples of modifying acid components may include, but are not limited to, isophthalic acid, phthalic acid, 1,3-cyclohexanedicarboxylic acid, 1,4-cyclohexane dicarboxylic acid, 2,6-naphthaline dicarboxylic acid, succinic acid, glutaric acid, adipic acid, sebacic acid, suberic acid, 1,12-dodecanedioic acid, etc. In practice, it is often preferable to use a functional acid derivative thereof such as the dimethyl, diethyl, or dipropyl ester of the dicarboxylic acid. The anhydrides or acid halides of these acids also may be employed where practical. Examples of modifying diol components may include, but are not limited to, neopentyl glycol, 1,4-cyclohexanedimethanol, 1,2-propanediol, 1,3-propanediol, 2-methy-1,3-propanediol, 1,4-butanediol, 1,6-hexanediol, 1,2-cyclohexanediol, 1,4-cyclohexanediol, 1,2-cyclohexanedimethanol, 1,3-cyclohexanedimethanol, 2,2,4,4-tetramethyl 1,3-cyclobutane diol, Z,8-bis (hydroxymethyltricyclo-[5.2.1.0]-decane wherein Z represents 3, 4, or 5; 1,4-bis(2-hydroxyethoxy)benzene, 4,4'-bis(2-hydroxyethoxy) diphenylether [bis-hydroxyethyl bisphenol A], 4,4'-Bis(2-hydroxyethoxy)diphenylsulfide [bis-hydroxyethyl bisphenol S] and diols containing one or more oxygen atoms in the chain, e.g. diethylene glycol, triethylene glycol, dipropylene glycol, tripropylene glycol, etc. In general, these diols contain 2 to 18, and in some embodiments, 2 to 8 carbon atoms. Cycloaliphatic diols can be employed in their cis- or trans-configuration or as mixtures of both forms.

The aromatic polyesters, such as described above, typically have a DTUL value of from about 40° C. to about 80° C., in some embodiments from about 45° C. to about 75° C., and in some embodiments, from about 50° C. to about 70° C. as determined in accordance with ISO 75-2:2013 at a load of 1.8 MPa. The aromatic polyesters likewise typically have a glass transition temperature of from about 30° C. to about 120° C., in some embodiments from about 40° C. to about 110° C., and in some embodiments, from about 50° C. to about 100° C., such as determined by ISO 11357-2:2020, as well as a melting temperature of from about 170° C. to about 300° C., in some embodiments from about 190° C. to about 280° C., and in some embodiments, from about 210° C. to about 260° C., such as determined in accordance with ISO 11357-2:2018. The aromatic polyesters may also have an intrinsic viscosity of from about 0.1 dl/g to about 6 dl/g, in some embodiments from about 0.2 to about 5 dl/g, and in some embodiments from about 0.3 to about 1 dl/g, such as determined in accordance with ISO 1628-5:1998.

Polyarylene sulfides are also suitable semi-crystalline aromatic polymers. The polyarylene sulfide may be homopolymers or copolymers. For instance, selective combination of dihaloaromatic compounds can result in a polyarylene sulfide copolymer containing not less than two different units. For instance, when p-dichlorobenzene is used in combination with m-dichlorobenzene or 4,4'-dichlorodiphenylsulfone, a polyarylene sulfide copolymer can be formed containing segments having the structure of formula:

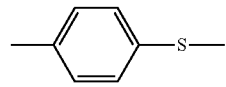

and segments having the structure of formula:

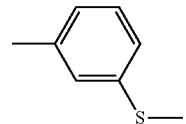

or segments having the structure of formula:

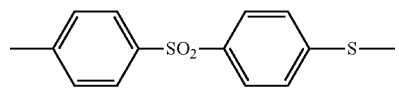

The polyarylene sulfide may be linear, semi-linear, branched or crosslinked. Linear polyarylene sulfides typically contain 80 mol % or more of the repeating unit —(Ar—S)—. Such linear polymers may also include a small amount of a branching unit or a cross-linking unit, but the amount of branching or cross-linking units is typically less than about 1 mol % of the total monomer units of the polyarylene sulfide. A linear polyarylene sulfide polymer may be a random copolymer or a block copolymer containing the above-mentioned repeating unit. Semi-linear polyarylene sulfides may likewise have a cross-linking structure or a branched structure introduced into the polymer a small amount of one or more monomers having three or more reactive functional groups. By way of example, monomer components used in forming a semi-linear polyarylene sulfide can include an amount of polyhaloaromatic compounds having two or more halogen substituents per molecule which can be utilized in preparing branched polymers. Such monomers can be represented by the formula $R'X_n$, where each X is selected from chlorine, bromine, and iodine, n is an integer of 3 to 6, and R' is a polyvalent aromatic radical of valence n which can have up to about 4 methyl substituents, the total number of carbon atoms in R' being within the range of 6 to about 16. Examples of some polyhaloaromatic compounds having more than two halogens substituted per molecule that can be employed in forming a semi-linear polyarylene sulfide include 1,2,3-trichlorobenzene, 1,2,4-trichlorobenzene, 1,3-dichloro-5-bromobenzene, 1,2,4-triiodobenzene, 1,2,3,5-tetrabromobenzene, hexachlorobenzene, 1,3,5-trichloro-2,4,6-trimethylbenzene, 2,2',4,4'-tetrachlorobiphenyl, 2,2',5,5'-tetra-iodobiphenyl, 2,2',6,6'-tetrabromo-3,3',5,5'-tetramethylbiphenyl, 1,2,3,4-tetrachloronaphthalene, 1,2,4-tribromo-6-methylnaphthalene, etc., and mixtures thereof.

The polyarylene sulfides, such as described above, typically have a DTUL value of from about 70° C. to about 220° C., in some embodiments from about 90° C. to about 200° C., and in some embodiments, from about 120° C. to about 180° C. as determined in accordance with ISO 75-2:2013 at a load of 1.8 MPa. The polyarylene sulfides likewise typically have a glass transition temperature of from about 50° C. to about 120° C., in some embodiments from about 60° C. to about 115° C., and in some embodiments from about 70° C. to about 110° C., such as determined by ISO 11357-2:2020, as well as a melting temperature of from about 220° C. to about 340° C., in some embodiments from about 240° C. to about 320° C., and in some embodiments, from about 260° C. to about 300° C., such as determined in accordance with ISO 11357-3:2018.

As indicated above, substantially amorphous polymers may also be employed that lack a distinct melting point temperature. Suitable amorphous polymers may include, for instance, aromatic polycarbonates, which typically contains repeating structural carbonate units of the formula —$R^1$—O—C(O)—O—. The polycarbonate is aromatic in that at least a portion (e.g., 60% or more) of the total number of $R^1$ groups contain aromatic moieties and the balance thereof are aliphatic, alicyclic, or aromatic. In one embodiment, for instance, $R^1$ may a $C_{6-30}$ aromatic group, that is, contains at least one aromatic moiety. Typically, $R^1$ is derived from a dihydroxy aromatic compound of the general formula HO—$R^1$—OH, such as those having the specific formula referenced below:

HO-$A^1$-$Y^1$-$A^2$-OH wherein, $A^1$ and $A^2$ are independently a monocyclic divalent aromatic group; and $Y^1$ is a single bond or a bridging group having one or more atoms that separate $A^1$ from $A^2$. In one particular embodiment, the dihydroxy aromatic compound may be derived from the following formula (I):

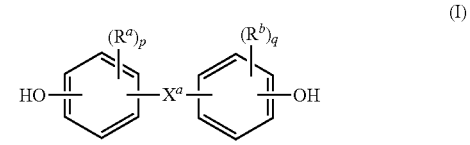

wherein, $R^a$ and $R^b$ are each independently a halogen or $C_{1-12}$ alkyl group, such as a $C_{1-3}$ alkyl group (e.g., methyl) disposed meta to the hydroxy group on each arylene group;

p and q are each independently 0 to 4 (e.g., 1); and $X^a$ represents a bridging group connecting the two hydroxy-substituted aromatic groups, where the bridging group and the hydroxy substituent of each $C_6$ arylene group are disposed ortho, meta, or para (specifically para) to each other on the $C_6$ arylene group.

In one embodiment, $X^a$ may be a substituted or unsubstituted $C_{3-18}$ cycloalkylidene, a $C_{1-25}$ alkylidene of formula —C($R^c$)($R^d$)— wherein $R^c$ and $R^d$ are each independently hydrogen, $C_{1-12}$ alkyl, $C_{1-12}$ cycloalkyl, $C_{7-12}$ arylalcyl, $C_{7-12}$ heteroalkyl, or cyclic $C_{7-12}$ heteroarylalkyl, or a group of the formula —C(=$R^e$)— wherein $R^e$ is a divalent $C_{1-12}$ hydrocarbon group. Exemplary groups of this type include methylene, cyclohexylmethylene, ethylidene, neopentylidene, and isopropylidene, as well as 2-[2.2.1]-bicycloheptylidene, cyclohexylidene, cyclopentylidene, cyclododecylidene, and adamantylidene. A specific example wherein $X^a$ is a substituted cycloalkylidene is the cyclohexylidene-bridged, alkyl-substituted bisphenol of the following formula (II):

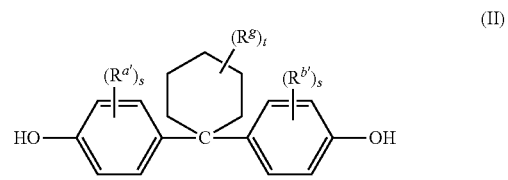

wherein, $R^{a'}$ and $R^{b'}$ are each independently $C_{1-12}$ alkyl (e.g., $C_{1-4}$ alkyl, such as methyl), and may optionally be disposed meta to the cyclohexylidene bridging group;

$R^g$ is $C_{1-12}$ alkyl (e.g., $C_{1-4}$ alkyl) or halogen;

r and s are each independently 1 to 4 (e.g., 1); and t is 0 to 10, such as 0 to 5.

The cyclohexylidene-bridged bisphenol can be the reaction product of two moles of o-cresol with one mole of cyclohexanone. In another embodiment, the cyclohexylidene-bridged bisphenol can be the reaction product of two moles of a cresol with one mole of a hydrogenated isophorone (e.g., 1,1,3-trimethyl-3-cyclohexane-5-one). Such cyclohexane-containing bisphenols, for example the reaction product of two moles of a phenol with one mole of a hydrogenated isophorone, are useful for making polycarbonate polymers with high glass transition temperatures and high heat distortion temperatures.

In another embodiment, $X^a$ may be a $C_{1-18}$ alkylene group, a $C_{3-18}$ cycloalkylene group, a fused $C_{6-18}$ cycloalkylene group, or a group of the formula —$B^1$—W—$B^2$—, wherein $B^1$ and $B^2$ are independently a $C_{1-6}$ alkylene group and W is a $C_{3-12}$ cycloalkylidene group or a $C_{6-16}$ arylene group.

$X^a$ may also be a substituted $C_{3-18}$ cycloalkylidene of the following formula (III):

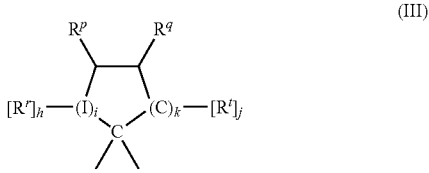

(III)

wherein, $R^r$, $R^p$, $R^q$, and $R^t$ are each independently hydrogen, halogen, oxygen, or $C_{1-12}$ organic groups;

l is a direct bond, a carbon, or a divalent oxygen, sulfur, or —N(Z)—, wherein Z is hydrogen, halogen, hydroxy, $C_{1-12}$ alkyl, $C_{1-12}$ alkoxy, or $C_{1-12}$ acyl;

h is 0 to 2;

j is 1 or 2;

i is 0 or 1; and k is 0 to 3, with the proviso that at least two of $R^r$, $R^p$, $R^q$, and $R^t$ taken together are a fused cycloaliphatic, aromatic, or heteroaromatic ring.

Other useful aromatic dihydroxy aromatic compounds include those having the following formula (IV):

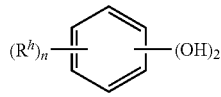

(IV)

wherein, $R^h$ is independently a halogen atom (e.g., bromine), $C_{1-10}$ hydrocarbyl (e.g., $C_{1-10}$ alkyl group), a halogen-substituted $C_{1-10}$ alkyl group, a $C_{6-10}$ aryl group, or a halogen-substituted $C_{6-10}$ aryl group;

n is 0 to 4.

Specific examples of bisphenol compounds of formula (I) include, for instance, 1,1-bis(4-hydroxyphenyl) methane, 1,1-bis(4-hydroxyphenyl) ethane, 2,2-bis(4-hydroxyphenyl) propane (hereinafter "bisphenol A" or "BPA"), 2,2-bis(4-hydroxyphenyl)butane, 2,2-bis(4-hydroxyphenyl)octane, 1,1-bis(4-hydroxyphenyl)propane, 1,1-bis(4-hydroxyphenyl) n-butane, 2,2-bis(4-hydroxy-1-methylphenyl)propane, 1,1-bis(4-hydroxy-t-butylphenyl)propane, 3,3-bis(4-hydroxyphenyl)phthalimidine, 2-phenyl-3,3-bis(4-hydroxyphenyl)phthalimidine (PPPBP), and 1,1-bis(4-hydroxy-3-methylphenyl)cyclohexane (DMBPC). In one specific embodiment, the polycarbonate may be a linear homopolymer derived from bisphenol A, in which each of $A^1$ and $A^2$ is p-phenylene and $Y^1$ is isopropylidene in formula (I).

Other examples of suitable aromatic dihydroxy compounds may include, but not limited to, 4,4'-dihydroxybiphenyl, 1,6-dihydroxynaphthalene, 2,6-dihydroxynaphthalene, bis(4-hydroxyphenyl)methane, bis(4-hydroxyphenyl) diphenylmethane, bis(4-hydroxyphenyl)-1-naphthylmethane, 1,2-bis(4-hydroxyphenyl)ethane, 1,1-bis(4-hydroxyphenyl)-1-phenylethane, 2-(4-hydroxyphenyl)-2-(3-hydroxyphenyl)propane, bis(4-hydroxyphenyl) phenylmethane, 2,2-bis(4-hydroxy-3-bromophenyl) propane, 1,1-bis(hydroxyphenyl)cyclopentane, 1,1-bis(4-hydroxyphenyl)cyclohexane, 1,1-bis(4-hydroxyphenyl) isobutene, 1,1-bis(4-hydroxyphenyl)cyclododecane, trans-2,3-bis(4-hydroxyphenyl)-2-butene, 2,2-bis(4-hydroxyphenyl)adamantane, alpha, alpha'-bis(4-hydroxyphenyl)toluene, bis(4-hydroxyphenyl)acetonitrile, 2,2-bis(3-methyl-4-hydroxyphenyl)propane, 2,2-bis(3-ethyl-4-hydroxyphenyl)propane, 2,2-bis(3-n-propyl-4-hydroxyphenyl)propane, 2,2-bis(3-isopropyl-4-hydroxyphenyl)propane, 2,2-bis(3-sec-butyl-4-hydroxyphenyl)propane, 2,2-bis(3-t-butyl-4-hydroxyphenyl)propane, 2,2-bis(3-cyclohexyl-4-hydroxyphenyl)propane, 2,2-bis(3-allyl-4-hydroxyphenyl)propane, 2,2-bis(3-methoxy-4-hydroxyphenyl)propane, 2,2-bis(4-hydroxyphenyl)hexafluoropropane, 1,1-dichloro-2,2-bis(4-hydroxyphenyl)ethylene, 1,1-dibromo-2,2-bis(4-hydroxyphenyl)ethylene, 1,1-dichloro-2,2-bis(5-phenoxy-4-hydroxyphenyl)ethylene 4,4'-dihydroxybenzophenone, 3,3-bis(4-hydroxyphenyl)-2-butanone, 1,6-bis(4-hydroxyphenyl)-1,6-hexanedione, ethylene glycol bis (4-hydroxyphenyl)ether, bis(4-hydroxyphenyl)ether, bis(4-hydroxyphenyl)sulfide, bis(4-hydroxyphenyl)sulfoxide, bis (4-hydroxyphenyl)sulfone, 9,9-bis(4-hydroxyphenyl) fluorine, 2,7-dihydroxypyrene, 6,6'-dihydroxy-3,3,3',3'-tetramethylspiro(bis)indane ("spirobiindane bisphenol"), 3,3-bis(4-hydroxyphenyl)phthalimide, 2,6-dihydroxydibenzo-p-dioxin, 2,6-dihydroxythianthrene, 2,7-dihydroxyphenoxathin, 2,7-dihydroxy-9,10-dimethylphenazine, 3,6-dihydroxydibenzofuran, 3,6-dihydroxydibenzothiophene, and 2,7-dihydroxycarbazole, resorcinol, substituted resorcinol compounds such as 5-methyl resorcinol, 5-ethyl resorcinol, 5-propyl resorcinol, 5-butyl resorcinol, 5-t-butyl resorcinol, 5-phenyl resorcinol, 5-cumyl resorcinol, 2,4,5,6-tetrafluoro resorcinol, 2,4,5,6-tetrabromo resorcinol, or the like; catechol; hydroquinone; substituted hydroquinones such as 2-methyl hydroquinone, 2-ethyl hydroquinone, 2-propyl hydroquinone, 2-butyl hydroquinone, 2-t-butyl hydroquinone, 2-phenyl hydroquinone, 2-cumyl hydroquinone, 2,3,5,6-tetramethyl hydroquinone, 2,3,5,6-tetra-t-butyl hydroquinone, 2,3,5,6-tetrafluoro hydroquinone, 2,3,5,6-tetrabromo hydroquinone, etc., as well as combinations thereof.

Aromatic polycarbonates, such as described above, typically have a DTUL value of from about 80° C. to about 300° C., in some embodiments from about 100° C. to about 250° C., and in some embodiments, from about 140° C. to about 220° C., as determined in accordance with ISO 75-2:2013 at a load of 1.8 MPa. The glass transition temperature may also be from about 50° C. to about 250° C., in some embodiments from about 90° C. to about 220° C., and in some embodiments, from about 100° C. to about 200° C., such as determined by ISO 11357-2:2020. Such polycarbonates may also have an intrinsic viscosity of from about 0.1 dl/g to about 6 dl/g, in some embodiments from about 0.2 to about 5 dl/g, and in some embodiments from about 0.3 to about 1 dl/g, such as determined in accordance with ISO 1628-4: 1998.

In addition to the polymers referenced above, highly crystalline aromatic polymers may also be employed in the polymer composition. Particularly suitable examples of such polymers are liquid crystalline polymers, which have a high degree of crystallinity that enables them to effectively fill the small spaces of a mold. Liquid crystalline polymers are generally classified as "thermotropic" to the extent that they can possess a rod-like structure and exhibit a crystalline behavior in their molten state (e.g., thermotropic nematic state). Such polymers typically have a DTUL value of from about 120° C. to about 340° C., in some embodiments from about 140° C. to about 320° C., and in some embodiments, from about 150° C. to about 300° C., as determined in accordance with ISO 75-2:2013 at a load of 1.8 MPa. The polymers also have a relatively high melting temperature, such as from about 250° C. to about 400° C., in some embodiments from about 280° C. to about 390° C., and in some embodiments, from about 300° C. to about 380° C. Such polymers may be formed from one or more types of repeating units as is known in the art. A liquid crystalline polymer may, for example, contain one or more aromatic ester repeating units generally represented by the following Formula (I):

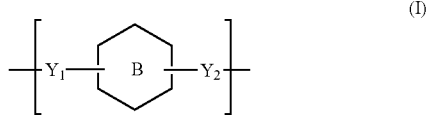

wherein, ring B is a substituted or unsubstituted 6-membered aryl group (e.g., 1,4-phenylene or 1,3-phenylene), a substituted or unsubstituted 6-membered aryl group fused to a substituted or unsubstituted 5- or 6-membered aryl group (e.g., 2,6-naphthalene), or a substituted or unsubstituted 6-membered aryl group linked to a substituted or unsubstituted 5- or 6-membered aryl group (e.g., 4,4-biphenylene); and $Y_1$ and $Y_2$ are independently O, C(O), NH, C(O)HN, or NHC(O).

Typically, at least one of $Y_1$ and $Y_2$ are C(O). Examples of such aromatic ester repeating units may include, for instance, aromatic dicarboxylic repeating units ($Y_1$ and $Y_2$ in Formula I are C(O)), aromatic hydroxycarboxylic repeating units ($Y_1$ is O and $Y_2$ is C(O) in Formula I), as well as various combinations thereof.

Aromatic hydroxycarboxylic repeating units, for instance, may be employed that are derived from aromatic hydroxycarboxylic acids, such as, 4-hydroxybenzoic acid; 4-hydroxy-4'-biphenylcarboxylic acid; 2-hydroxy-6-naphthoic acid; 2-hydroxy-5-naphthoic acid; 3-hydroxy-2-naphthoic acid; 2-hydroxy-3-naphthoic acid; 4'-hydroxyphenyl-4-benzoic acid; 3'-hydroxyphenyl-4-benzoic acid; 4'-hydroxyphenyl-3-benzoic acid, etc., as well as alkyl, alkoxy, aryl and halogen substituents thereof, and combination thereof. Particularly suitable aromatic hydroxycarboxylic acids are 4-hydroxybenzoic acid ("HBA") and 6-hydroxy-2-naphthoic acid ("HNA"). When employed, repeating units derived from hydroxycarboxylic acids (e.g., HBA and/or HNA) typically constitute about 40 mol. % or more, in some embodiments about 45 mol. % or more, and in some embodiments, from about 50 mol. % to 100 mol. % of the polymer. In one embodiment, for example, repeating units derived from HBA may constitute from about 30 mol. % to about 90 mol. % of the polymer, in some embodiments from about 40 mol. % to about 85 mol. % of the polymer, and in some embodiments from about 50 mol. % to about 80 mol. % of the polymer. Repeating units derived from HNA may likewise constitute from about 1 mol. % to about 30 mol. % of the polymer, in some embodiments from about 2 mol. % to about 25 mol. % of the polymer, and in some embodiments, from about 3 mol. % to about 15 mol. % of the polymer.

Aromatic dicarboxylic repeating units may also be employed that are derived from aromatic dicarboxylic acids, such as terephthalic acid, isophthalic acid, 2,6-naphthalenedicarboxylic acid, diphenyl ether-4,4'-dicarboxylic acid, 1,6-naphthalenedicarboxylic acid, 2,7-naphthalenedicarboxylic acid, 4,4'-dicarboxybiphenyl, bis(4-carboxyphenyl) ether, bis(4-carboxyphenyl)butane, bis(4-carboxyphenyl) ethane, bis(3-carboxyphenyl)ether, bis(3-carboxyphenyl) ethane, etc., as well as alkyl, alkoxy, aryl and halogen substituents thereof, and combinations thereof. Particularly suitable aromatic dicarboxylic acids may include, for instance, terephthalic acid ("TA"), isophthalic acid ("IA"), and 2,6-naphthalenedicarboxylic acid ("NDA"). When employed, repeating units derived from aromatic dicarboxylic acids (e.g., IA, TA, and/or NDA) typically constitute from about 1 mol. % to about 50 mol. %, in some embodiments from about 2 mol. % to about 40 mol. %, and in some embodiments, from about 5 mol. % to about 30% of the polymer.

Other repeating units may also be employed in the polymer. In certain embodiments, for instance, repeating units may be employed that are derived from aromatic diols, such as hydroquinone, resorcinol, 2,6-dihydroxynaphthalene, 2,7-dihydroxynaphthalene, 1,6-dihydroxynaphthalene, 4,4'-dihydroxybiphenyl (or 4,4'-biphenol), 3,3'-dihydroxybiphenyl, 3,4'-dihydroxybiphenyl, 4,4'-dihydroxybiphenyl ether, bis(4-hydroxyphenyl)ethane, etc., as well as alkyl, alkoxy, aryl and halogen substituents thereof, and combinations thereof. Particularly suitable aromatic diols may include, for instance, hydroquinone ("HQ") and 4,4'-biphenol ("BP"). When employed, repeating units derived from aromatic diols (e.g., HQ and/or BP) typically constitute from about 1 mol. % to about 30 mol. %, in some embodiments from about 2 mol. % to about 25 mol. %, and in some embodiments, from about 5 mol. % to about 20% of the polymer. Repeating units may also be employed, such as those derived from aromatic amides (e.g., acetaminophen ("APAP")) and/or aromatic amines (e.g., 4-aminophenol ("AP"), 3-aminophenol, 1,4-phenylenediamine, 1,3-phenylenediamine, etc.). When employed, repeating units derived from aromatic amides (e.g., APAP) and/or aromatic amines (e.g., AP) typically constitute from about 0.1 mol. % to about 20 mol. %, in some embodiments from about 0.5 mol. % to about 15 mol. %, and in some embodiments, from about 1 mol. % to about 10% of the polymer. It should also be understood that various other monomeric repeating units may be incorporated into the polymer. For instance, in certain embodiments, the polymer may contain one or more repeating units derived from non-aromatic monomers, such as aliphatic or cycloaliphatic hydroxycarboxylic acids, dicarboxylic acids, diols, amides, amines, etc. Of course, in other embodiments, the polymer may be "wholly aromatic" in that it lacks repeating units derived from non-aromatic (e.g., aliphatic or cycloaliphatic) monomers.

Although not necessarily required, the liquid crystalline polymer may be a "low naphthenic" polymer to the extent that it contains a relatively high content of repeating units derived from naphthenic hydroxycarboxylic acids and naphthenic dicarboxylic acids, such as naphthalene-2,6-dicarboxylic acid ("NDA"), 6-hydroxy-2-naphthoic acid ("HNA"), or combinations thereof. That is, the total amount of repeating units derived from naphthenic hydroxycarboxylic and/or dicarboxylic acids (e.g., NDA, HNA, or a combination of HNA and NDA) is typically about 15 mol. % or less, in some embodiments about 10 mol. % or less, and in some embodiments, from about 1 mol. % to about 8 mol. % of the polymer. In one particular embodiment, for instance, the repeating units derived from naphthalene-2,6-dicarboxylic acid ("HNA") may be present in an amount of only from about 0.5 mol. % to about 15 mol. %, in some embodiments from about 1 mol. % to about 10 mol. %, and in some embodiments, from about 2 mol. % to about 8 mol. % of the polymer. In such embodiments, the liquid crystalline polymer may also contain various other monomers, such as aromatic hydroxycarboxylic acid(s) (e.g., HBA) in an amount of from about 30 mol. % to about 70 mol. %, and in some embodiments, from about 40 mol. % to about 65 mol. %; aromatic dicarboxylic acid(s) (e.g., IA and/or TA) in an amount of from about 2 mol. % to about 30 mol. %, and in some embodiments, from about 5 mol. % to about 25 mol. %; and/or aromatic diol(s) (e.g., BP and/or HQ) in an amount of from about 2 mol. % to about 40 mol. %, and in some embodiments, from about 5 mol. % to about 35 mol. %.

Of course, in other embodiments, the liquid crystalline polymer may be a "high naphthenic" polymer to the extent that it contains a relatively high content of repeating units derived from naphthenic hydroxycarboxylic acids and naphthenic dicarboxylic acids, such as naphthalene-2,6-dicarboxylic acid ("NDA"), 6-hydroxy-2-naphthoic acid ("HNA"), or combinations thereof. That is, the total amount of repeating units derived from naphthenic hydroxycarboxylic and/or dicarboxylic acids (e.g., NDA, HNA, or a combination of HNA and NDA) is typically greater than about 15 mol. %, in some embodiments about 18 mol. % or more, and in some embodiments, from about 20 mol. % to about 60 mol. % of the polymer. In one particular embodiment, for instance, the repeating units derived from naphthalene-2,6-dicarboxylic acid ("NDA") may constitute from about 10 mol. % to about 40 mol. %, in some embodiments from about 12 mol. % to about 35 mol. %, and in some embodiments, from about 15 mol. % to about 30 mol. % of the polymer. In such embodiments, the liquid crystalline polymer may also contain various other monomers, such as aromatic hydroxycarboxylic acid(s) (e.g., HBA) in an amount of from about 20 mol. % to about 60 mol. %, and in some embodiments, from about 30 mol. % to about 50 mol. %; aromatic dicarboxylic acid(s) (e.g., IA and/or TA) in an amount of from about 2 mol. % to about 30 mol. %, and in some embodiments, from about 5 mol. % to about 25 mol. %; and/or aromatic diol(s) (e.g., BP and/or HQ) in an amount of from about 2 mol. % to about 40 mol. %, and in some embodiments, from about 5 mol. % to about 35 mol. %.

In certain embodiments, all of the liquid crystalline polymers are "low naphthenic" polymers such as described above. In other embodiments, all of the liquid crystalline polymers are "high naphthenic" polymers such as described above. In some cases, blends of such polymers may also be used. For example, low naphthenic liquid crystalline polymers may constitute from about 1 wt. % to about 50 wt. %, in some embodiments from about 2 wt. % to about 40 wt. %, and in some embodiments, from about 5 wt. % to about 30 wt. % of the total amount of liquid crystalline polymers in the composition, and high naphthenic liquid crystalline polymers may constitute from about 50 wt. % to about 99 wt. %, in some embodiments from about 60 wt. % to about 98 wt. %, and in some embodiments, from about 70 wt. % to about 95 wt. % of the total amount of liquid crystalline polymers in the composition.

B. Electrically Conductive Filler

As indicated above, an electrically conductive filler is also employed in the polymer composition to help achieve the desired surface and/or volume resistivity values for the polymer composition. This may be accomplished by selecting a single material for the filler having the desired resistivity, or by blending multiple materials together (e.g., insulative and electrically conductive) so that the resulting filler has the desired resistivity. In one particular embodiment, for example, an electrically conductive material may be employed that has a volume resistivity of less than about 1 ohm-cm, in some embodiments about less than about 0.1 ohm-cm, and in some embodiments, from about $1 \times 10^{-8}$ ohm-cm to about $1 \times 10^{-2}$ ohm-cm, such as determined at a temperature of about 20° C. in accordance with ASTM D257-14 (technically equivalent to IEC 62631-3-1). Suitable electrically conductive carbon materials may include, for instance, graphite, carbon black, carbon fibers, graphene, carbon nanotubes, etc. Other suitable electrically conductive fillers may likewise include metals (e.g., metal particles, metal flakes, metal fibers, etc.), ionic liquids, and so forth. Regardless of the materials employed, the electrically conductive filler typically constitutes from about 0.5 to about 20 parts, in some embodiments from about 1 to about 15 parts, and in some embodiments, from about 2 to about 8 parts by weight per 100 parts by weight of the polymer matrix. For example, the electrically conductive filler may constitute from about 0.1 wt. % to about 10 wt. %, in some embodiments from about 0.2 wt. % to about 8 wt. %, and in some embodiments, from about 0.5 wt. % to about 4 wt. % of the polymer composition.

C. Mineral Filler

If desired, the polymer composition may also contain one or more mineral fillers distributed within the polymer matrix. Such mineral fillers typically constitute from about 10 to about 80 parts, in some embodiments from about 20 to about 70 parts, and in some embodiments, from about 30 to about 60 parts per 100 parts by weight of the polymer matrix. The mineral filler may, for instance, constitute from about 5 wt. % to about 60 wt. %, in some embodiments from about 10 wt. % to about 55 wt. %, and in some embodiments, from about 25 wt. % to about 40 wt. % of the polymer composition. Further, the weight ratio of the mineral filler to the electrically conductive filler may range from about 2 to about 500, in some embodiments from about 3 to about 150, in some embodiments from about 4 to about 75, and in some embodiments, from about 5 to about 15. By selectively tailoring the type and relative amount of the mineral filler, the present inventor has not only discovered that the mechanical properties can be improved, but also that the thermal conductivity can be increased without significantly impacting the overall electrical conductivity of the polymer composition. This allows the composition to be capable of creating a thermal pathway for heat transfer away from the resulting electronic device so that "hot spots" can be quickly eliminated and the overall temperature can be lowered during use. The composition may, for example, exhibit an in-plane thermal conductivity of about 0.2 W/m-K or more, in some embodiments about 0.5 W/m-K or more, in some embodiments about 0.6 W/m-K or more, in some embodiments about 0.8 W/m-K or more, and in some embodiments, from about 1 to about 3.5 W/m-K, as determined in accordance with ASTM E 1461-13. The composition may also exhibit a through-plane thermal conductivity of about 0.3 W/m-K or more, in some embodiments about 0.5 W/m-K or more, in some embodiments about 0.40 W/m-K or more, and in some embodiments, from about 0.7 to about 2 W/m-K, as determined in accordance with ASTM E 1461-13. Notably, it has been discovered that such a thermal conductivity can be achieved without use of conventional materials having a high degree of intrinsic thermal conductivity. For example, the polymer composition may be generally free of fillers having an intrinsic thermal conductivity of 50 W/m-K or more, in some embodiments 100 W/m-K or more, and in some embodiments, 150 W/m-K or more. Examples of such high intrinsic thermally conductive materials may include, for instance, boron nitride, aluminum nitride, magnesium silicon nitride, graphite (e.g., expanded graphite), silicon carbide, carbon nanotubes, zinc oxide, magnesium oxide, beryllium oxide, zirconium oxide, yttrium oxide, aluminum powder, and copper powder. While it is normally desired to minimize the presence of such high intrinsic thermally conductive materials, they may nevertheless be present in a relatively small percentage in certain embodiments, such as in an amount of about 10 wt. % or less, in some embodiments about 5 wt. % or less, and in some embodiments, from about 0.01 wt. % to about 2 wt. % of the polymer composition.

The nature of the mineral filler employed in the polymer composition may vary, such as mineral particles, mineral fibers (or "whiskers"), etc., as well as blends thereof. Suitable mineral fibers may, for instance, include those that are derived from silicates, such as neosilicates, sorosilicates, inosilicates (e.g., calcium inosilicates, such as wollastonite; calcium magnesium inosilicates, such as tremolite; calcium magnesium iron inosilicates, such as actinolite; magnesium iron inosilicates, such as anthophyllite; etc.), phyllosilicates (e.g., aluminum phyllosilicates, such as palygorskite), tectosilicates, etc.; sulfates, such as calcium sulfates (e.g., dehydrated or anhydrous gypsum); mineral wools (e.g., rock or slag wool); and so forth. Particularly suitable are inosilicates, such as wollastonite fibers available from Nyco Minerals under the trade designation NYGLOS® (e.g., NYGLOS® 4 W or NYGLOS® 8). The mineral fibers may have a median diameter of from about 1 to about 35 micrometers, in some embodiments from about 2 to about 20 micrometers, in some embodiments from about 3 to about 15 micrometers, and in some embodiments, from about 7 to about 12 micrometers. The mineral fibers may also have a narrow size distribution. That is, at least about 60% by volume of the fibers, in some embodiments at least about 70% by volume of the fibers, and in some embodiments, at least about 80% by volume of the fibers may have a size within the ranges noted above. Without intending to be limited by theory, it is believed that mineral fibers having the size characteristics noted above can more readily move through molding equipment, which enhances the distribution within the polymer matrix and minimizes the creation of surface defects. In addition to possessing the size characteristics noted above, the mineral fibers may also have a relatively high aspect ratio (average length divided by median diameter) to help further improve the mechanical properties and surface quality of the resulting polymer composition. For example, the mineral fibers may have an aspect ratio of from about 2 to about 100, in some embodiments from about 2 to about 50, in some embodiments from about 3 to about 20, and in some embodiments, from about 4 to about 15. The volume average length of such mineral fibers may, for example, range from about 1 to about 200 micrometers, in some embodiments from about 2 to about 150 micrometers, in some embodiments from about 5 to about 100 micrometers, and in some embodiments, from about 10 to about 50 micrometers.

Other suitable mineral fillers are mineral particles. The average diameter of the particles may, for example, range from about 5 micrometers to about 200 micrometers, in some embodiments from about 8 micrometers to about 150 micrometers, and in some embodiments, from about 10 micrometers to about 100 micrometers. The shape of the particles may vary as desired, such as granular, flake-shaped, etc. Flake-shaped particles, for instance, may be employed that have a relatively high aspect ratio (e.g., average diameter divided by average thickness), such as about 4 or more, in some embodiments about 8 or more, and in some embodiments, from about 10 to about 500. The average thickness of such flake-shaped particles may likewise be about 2 micrometers or less, in some embodiments from about 5 nanometers to about 1 micrometer, and in some embodiments, from about 20 nanometers to about 500 nanometers. Regardless of their shape and size, the particles are typically formed from a natural and/or synthetic silicate mineral, such as talc, mica, halloysite, kaolinite, illite, montmorillonite, vermiculite, palygorskite, pyrophyllite, calcium silicate, aluminum silicate, wollastonite, etc. Talc and mica are particularly suitable. Any form of mica may generally be employed, including, for instance, muscovite ($KAl_2(AlSi_3)O_{10}(OH)_2$), biotite ($K(Mg,Fe)_3(AlSi_3)O_{10}(OH)_2$), phlogopite ($KMg_3(AlSi_3)O_{10}(OH)_2$), lepidolite ($K(Li,Al)_{2-3}(AlSi_3)O_{10}(OH)_2$), glauconite ($(K,Na)(Al,Mg,Fe)_2(Si,Al)_4O_{10}(OH)_2$), etc. Muscovite-based mica is particularly suitable for use in the polymer composition.

D. Optional Additives

A wide variety of additional additives can also be included in the polymer composition, such as glass fibers, impact modifiers, lubricants, pigments (e.g., carbon black), antioxidants, stabilizers, surfactants, waxes, flame retardants, anti-drip additives, nucleating agents (e.g., boron nitride) and other materials added to enhance properties and processability. Lubricants, for example, may be employed in the polymer composition in an amount from about 0.05 wt. % to about 1.5 wt. %, and in some embodiments, from about 0.1 wt. % to about 0.5 wt. % (by weight) of the polymer composition. Examples of such lubricants include fatty acids esters, the salts thereof, esters, fatty acid amides, organic phosphate esters, and hydrocarbon waxes of the type commonly used as lubricants in the processing of engineering plastic materials, including mixtures thereof. Suitable fatty acids typically have a backbone carbon chain of from about 12 to about 60 carbon atoms, such as myristic acid, palmitic acid, stearic acid, arachic acid, montanic acid, octadecinic acid, parinric acid, and so forth. Suitable esters include fatty acid esters, fatty alcohol esters, wax esters, glycerol esters, glycol esters and complex esters. Fatty acid amides include fatty primary amides, fatty secondary amides, methylene and ethylene bisamides and alkanolamides such as, for example, palmitic acid amide, stearic acid amide, oleic acid amide, N,N'-ethylenebisstearamide and so forth. Also suitable are the metal salts of fatty acids such as calcium stearate, zinc stearate, magnesium stearate, and so forth; hydrocarbon waxes, including paraffin waxes, polyolefin and oxidized polyolefin waxes, and microcrystalline waxes. Particularly suitable lubricants are acids, salts, or amides of stearic acid, such as pentaerythritol tetrastearate, calcium stearate, or N,N'-ethylenebisstearamide. Yet another suitable lubricant may be a siloxane polymer that improves internal lubrication and that also helps to bolster the wear and friction properties of the composition encountering another surface. Such siloxane polymers typically constitute from about 0.2 to about 20 parts, in some embodiments from about 0.5 to about 10 parts, and in some embodiments, from about 0.8 to about 5 parts per 100 parts of the polymer matrix employed in the composition. Any of a variety of siloxane polymers may generally be employed. The siloxane polymer may, for instance, encompass any polymer, co-polymer or oligomer that includes siloxane units in the backbone having the formula:

$$R_rSiO_{(4-r/2)}$$

wherein

R is independently hydrogen or substituted or unsubstituted hydrocarbon radicals, and r is 0, 1, 2 or 3.

Some examples of suitable radicals R include, for instance, alkyl, aryl, alkylaryl, alkenyl or alkynyl, or cycloalkyl groups, optionally substituted, and which may be interrupted by heteroatoms, i.e., may contain heteroatom(s) in the carbon chains or rings. Suitable alkyl radicals, may include, for instance, methyl, ethyl, n-propyl, isopropyl, n-butyl, isobutyl, tert-butyl, n-pentyl, isopentyl, neopentyl and tert-pentyl radicals, hexyl radicals (e.g., n-hexyl), heptyl radicals (e.g., n-heptyl), octyl radicals (e.g., n-octyl), isooctyl radicals (e.g., 2,2,4-trimethylpentyl radical), nonyl radicals (e.g., n-nonyl), decyl radicals (e.g., n-decyl), dodecyl radicals (e.g., n-dodecyl), octadecyl radicals (e.g., n-octadecyl), and so forth. Likewise, suitable cycloalkyl radicals may include cyclopentyl, cyclohexyl, cycloheptyl radicals, methylcyclohexyl radicals, and so forth; suitable aryl radicals may include phenyl, biphenyl, naphthyl, anthryl, and phenanthryl radicals; suitable alkylaryl radicals may include o-, m- or p-tolyl radicals, xylyl radicals, ethylphenyl radicals, and so forth; and suitable alkenyl or alkynyl radicals may include vinyl, 1-propenyl, 1-butenyl, 1-pentenyl, 5-hexenyl, butadienyl, hexadienyl, cyclopentenyl, cyclopentadienyl, cyclohexenyl, ethynyl, propargyl, 1-propynyl, and so forth. Examples of substituted hydrocarbon radicals are halogenated alkyl radicals (e.g., 3-chloropropyl, 3,3,3-trifluoropropyl, and perfluorohexylethyl) and halogenated aryl radicals (e.g., p-chlorophenyl and p-chlorobenzyl). In one particular embodiment, the siloxane polymer includes alkyl radicals (e.g., methyl radicals) bonded to at least 70 mol % of the Si atoms and optionally vinyl and/or phenyl radicals bonded to from 0.001 to 30 mol % of the Si atoms. The siloxane polymer is also preferably composed predominantly of diorganosiloxane units. The end groups of the polyorganosiloxanes may be trialkylsiloxy groups, in particular the trimethylsiloxy radical or the dimethylvinylsiloxy radical. However, it is also possible for one or more of these alkyl groups to have been replaced by hydroxy groups or alkoxy groups, such as methoxy or ethoxy radicals. Particularly suitable examples of the siloxane polymer include, for instance, dimethylpolysiloxane, phenylmethylpolysiloxane, vinylmethylpolysiloxane, and trifluoropropylpolysiloxane.

The siloxane polymer may also include a reactive functionality on at least a portion of the siloxane monomer units of the polymer, such as one or more of vinyl groups, hydroxyl groups, hydrides, isocyanate groups, epoxy groups, acid groups, halogen atoms, alkoxy groups (e.g., methoxy, ethoxy and propoxy), acyloxy groups (e.g., acetoxy and octanoyloxy), ketoximate groups (e.g., dimethylketoxime, methylketoxime and methylethylketoxime), amino groups (e.g., dimethylamino, diethylamino and butylamino), amido groups (e.g., N-methylacetamide and N-ethylacetamide), acid amido groups, amino-oxy groups, mercapto groups, alkenyloxy groups (e.g., vinyloxy, isopropenyloxy, and 1-ethyl-2-methylvinyloxy), alkoxyalkoxy groups (e.g., methoxyethoxy, ethoxyethoxy and methoxypropoxy), aminoxy groups (e.g., dimethylaminoxy and diethylaminoxy), mercapto groups, etc.

Regardless of its particular structure, the siloxane polymer typically has a relatively high molecular weight, which reduces the likelihood that it migrates or diffuses to the surface of the polymer composition and thus further minimizes the likelihood of phase separation. For instance, the siloxane polymer typically has a weight average molecular weight of about 100,000 grams per mole or more, in some embodiments about 200,000 grams per mole or more, and in some embodiments, from about 500,000 grams per mole to about 2,000,000 grams per mole. The siloxane polymer may also have a relative high kinematic viscosity, such as about 10,000 centistokes or more, in some embodiments about 30,000 centistokes or more, and in some embodiments, from about 50,000 to about 500,000 centistokes.

If desired, silica particles (e.g., fumed silica) may also be employed in combination with the siloxane polymer to help improve its ability to be dispersed within the composition. Such silica particles may, for instance, have a particle size of from about 5 nanometers to about 50 nanometers, a surface area of from about 50 square meters per gram ($m^2/g$) to about 600 $m^2/g$, and/or a density of from about 160 kilogram per cubic meter ($kg/m^3$) to about 190 $kg/m^3$. When employed, the silica particles typically constitute from about 1 to about 100 parts, and in some some embodiments, from about 20 to about 60 parts by weight based on 100 parts by weight of the siloxane polymer. In one embodiment, the silica particles can be combined with the siloxane polymer prior to addition of this mixture to the polymer composition. For instance, a mixture including an ultrahigh molecular weight polydimethylsiloxane and fumed silica can be incorporated in the polymer composition. Such a pre-formed mixture is available as Genioplast® Pellet S from Wacker Chemie, AG.

The components used to form the polymer composition may be combined together using any of a variety of different techniques as is known in the art. In one particular embodiment, for example, a thermoplastic high performance polymer, electrically conductive filler, and other optional additives are melt processed as a mixture within an extruder to form the polymer composition. The mixture may be melt-kneaded in a single-screw or multi-screw extruder, such as at a temperature of from about 250° C. to about 450° C. In one embodiment, the mixture may be melt processed in an extruder that includes multiple temperature zones. The temperature of individual zones is typically set within about −60° C. to about 25° C. relative to the melting temperature of the polymer. By way of example, the mixture may be melt processed using a twin screw extruder such as a Leistritz 18-mm co-rotating fully intermeshing twin screw extruder. A general purpose screw design can be used to melt process the mixture. In one embodiment, the mixture including all of the components may be fed to the feed throat in the first barrel by means of a volumetric feeder. In another embodiment, different components may be added at different addition points in the extruder, as is known. For example, the polymer may be applied at the feed throat, and certain additives (e.g., electrically conductive filler) may be supplied at the same or different temperature zone located downstream therefrom. Regardless, the resulting mixture can be melted and mixed then extruded through a die. The extruded polymer composition can then be quenched in a water bath to solidify and granulated in a pelletizer followed by drying.

The melt viscosity of the resulting composition is generally low enough that it can readily flow into the cavity of a mold to form the small-sized circuit substrate. For example, in one particular embodiment, the polymer composition may have a melt viscosity of from about 10 to about 250 Pa-s, in some embodiments from about 15 to about 200 Pa-s, in some embodiments from about 20 to about 150 Pa-s, and in some embodiments, from about 30 to about 100 Pa-s, determined at a shear rate of 1,000 seconds$^{-1}$. Melt viscosity may be determined in accordance with ISO Test No. 11443: 2014 at a temperature that is 15° C. higher than the melting temperature of the composition (e.g., about 340° C. for a melting temperature of about 325° C.).

II. Substrate

The substrate may be formed from the polymer composition using a variety of different techniques. Suitable techniques may include, for instance, injection molding, low-pressure injection molding, extrusion compression molding, gas injection molding, foam injection molding, low-pressure gas injection molding, low-pressure foam injection molding, gas extrusion compression molding, foam extrusion compression molding, extrusion molding, foam extrusion molding, compression molding, foam compression molding, gas compression molding, etc. For example, an injection molding system may be employed that includes a mold within which the polymer composition may be injected. The time inside the injector may be controlled and optimized so that polymer matrix is not pre-solidified. When the cycle time is reached and the barrel is full for discharge, a piston may be used to inject the composition to the mold cavity. Compression molding systems may also be employed. As with injection molding, the shaping of the polymer composition into the desired article also occurs within a mold. The composition may be placed into the compression mold using any known technique, such as by being picked up by an automated robot arm. The temperature of the mold may be maintained at or above the solidification temperature of the polymer composition for a desired time period to allow for solidification. The molded product may then be solidified by bringing it to a temperature below that of the melting temperature. The resulting product may be de-molded. The cycle time for each molding process may be adjusted to suit the polymer composition, to achieve sufficient bonding, and to enhance overall process productivity. Due in part to the beneficial properties of the polymer composition, the resulting substrate may have a very small size, such as a thickness of about 5 millimeters or less, in some embodiments about 4 millimeters or less, and in some embodiments, from about 0.5 to about 3 millimeters. Typically, the shaped parts are molded using a one-component injection molding process.

III. Conductive Elements

One or more conductive elements may be deposited on the substrate using any of a variety of known metal deposition techniques, such as plating (e.g., electrolytic plating, electroless plating, etc.), printing (e.g., digital printing, aerosol jet printing, etc.), and so forth. The conductive elements may contain one or more of a variety of conductive materials, such as a metal, e.g. gold, silver, nickel, aluminum, copper, as well as mixture or alloys thereof. In one embodiment, for instance, the conductive elements may include copper and/or nickel (e.g., pure or alloys thereof). If desired, a seed layer may initially be formed on the substrate to facilitate the metal deposition process.

When plating is employed as a deposition technique, the process may vary as desired. In certain embodiments, for instance, the process may include initially forming a pattern on the surface of the substrate based on the desired circuit interconnect pattern. This may be accomplished using various known techniques, such as laser ablation or patterning, plasma etching, ultraviolet light treatment, acid etching, etc. Regardless, after forming the desired pattern on the substrate, the patterned regions may then optionally be subjected to an activation process to prepare for subsequent metal deposition. During this process, the patterned substrate may be contacted with an activation solution that contains a metal, such as palladium, platinum, iridium, rhodium, etc., as well as mixtures thereof. Palladium is particularly suitable. Once the surface has been conditioned as described above, a first metal layer may then be formed thereon on the patterned substrate, such as through a process known as electroless plating. Electroless plating may occur through auto-catalytic reactions in which the metal deposited on the surface acts as a catalyst for further depositing. Typically, nickel and/or copper are electrolessly plated onto the surface of the patterned substrate. Electroless nickel plating may be accomplished, for example, using a solution that contains a nickel salt (e.g., nickel sulfate). If desired, the patterned substrate may also be subjected to one or more additional steps to form the final metal coating layer(s). Additional coating layer(s) are typically deposited using a process known as electrolytic plating, during which the patterned substrate is contacted with a metal solution and subjected to an electrical current to initiate deposition of the metal. For example, a second metal layer may be electrolytically deposited over the first metal layer (e.g., electrolessly plated copper and/or nickel). The second metal layer may include, for instance, copper or nickel. In certain embodiments, one or more additional metal layer(s), such as copper and/or nickel, may also be electrolytically deposited over the second metal layer.

IV. Electronic Component

The circuit structure of the present invention may be employed in a wide variety of electronic components, such as a printed circuit board, flex circuit, connector, thermal management feature, EMI shielding, high current conductor, RFID apparatus, antenna, wireless power device, sensor, MEMS apparatus, LED device, microprocessor, memory device, ASIC, passive device, impedance control device, electro-mechanical apparatus, sensors, or a combination thereof. In one embodiment, for instance, the conductive elements may be antenna elements (e.g., antenna resonating elements) so that the resulting part forms an antenna system. The conductive elements can form antennas of a variety of different types, such as antennae with resonating elements that are formed from patch antenna elements, inverted-F antenna elements, closed and open slot antenna elements, loop antenna elements, monopoles, dipoles, planar inverted-F antenna elements, hybrids of these designs, etc. The resulting antenna system can be employed in a variety of different electronic components. As an example, the antenna system may be formed in electronic components, such as desktop computers, portable computers, handheld electronic devices, automotive equipment, etc. In one suitable configuration, the antenna system is formed in the housing of a relatively compact portable electronic component in which the available interior space is relatively small. Examples of suitable portable electronic components include cellular telephones, laptop computers, small portable computers (e.g., ultraportable computers, netbook computers, and tablet computers), wrist-watch devices, pendant devices, headphone and earpiece devices, media players with wireless communications capabilities, handheld computers (also sometimes called personal digital assistants), remote controllers, global positioning system (GPS) devices, handheld gaming devices, etc. The antenna could also be integrated with other components such as camera module, speaker or battery cover of a handheld device.

Figure 2:
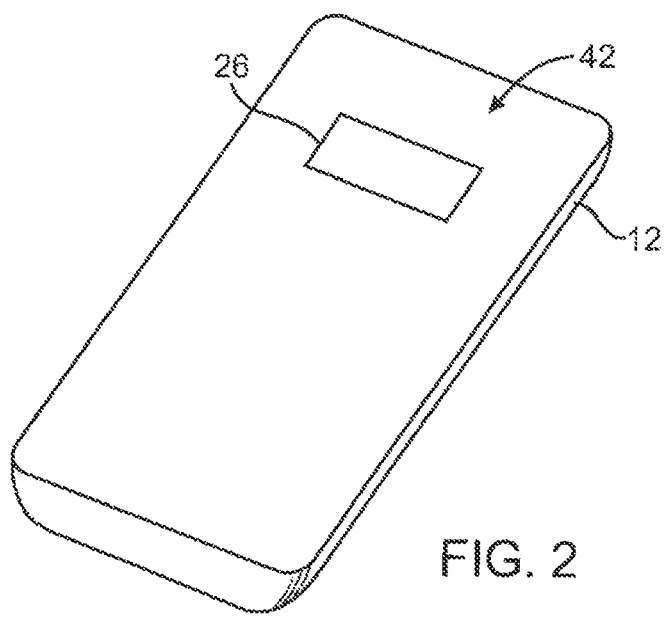
Figure 3:
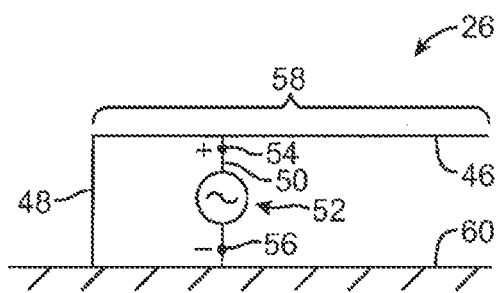
FIG. 3 is a top view of an illustrative inverted-F antenna resonating element for one embodiment of an antenna system.

One particularly suitable electronic component is shown in FIGS. 1-2 is a handheld device 10 with cellular telephone capabilities. As shown in FIG. 1, the device 10 may have a housing 12 formed from plastic, metal, other suitable dielectric materials, other suitable conductive materials, or combinations of such materials. A display 14 may be provided on a front surface of the device 10, such as a touch screen display. The device 10 may also have a speaker port 40 and other input-output ports. One or more buttons 38 and other user input devices may be used to gather user input. As shown in FIG. 2, an antenna system 26 is also provided on a rear surface 42 of device 10, although it should be understood that the antenna system can generally be positioned at any desired location of the device. The antenna system may be electrically connected to other components within the electronic device using any of a variety of known techniques. Referring again to FIGS. 1-2, for example, the housing 12 or a part of housing 12 may serve as a conductive ground plane for the antenna system 26. This is more particularly illustrated in FIG. 3, which shows the antenna system 26 as being fed by a radio-frequency source 52 at a positive antenna feed terminal 54 and a ground antenna feed terminal 56. The positive antenna feed terminal 54 may be coupled to an antenna resonating element 58, and the ground antenna feed terminal 56 may be coupled to a ground element 60. The resonating element 58 may have a main arm 46 and a shorting branch 48 that connects main arm 46 to ground 60.

Figure 4:
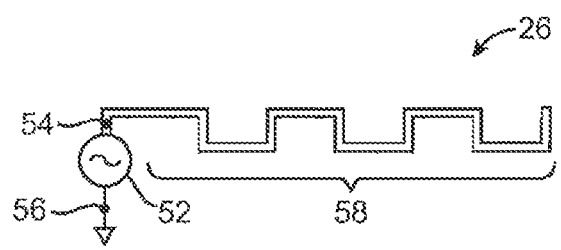
FIG. 4 is a top view of an illustrative monopole antenna resonating element for one embodiment of an antenna system.
Figure 5:
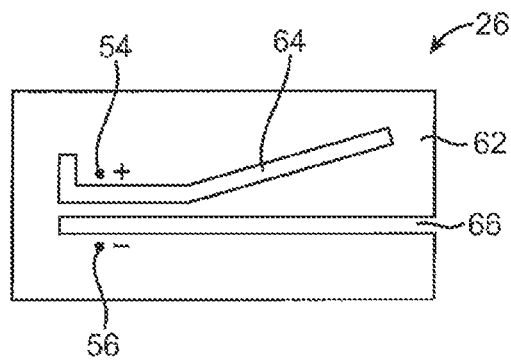
FIG. 5 is a top view of an illustrative slot antenna resonating element for one embodiment of an antenna system.
Figure 6:
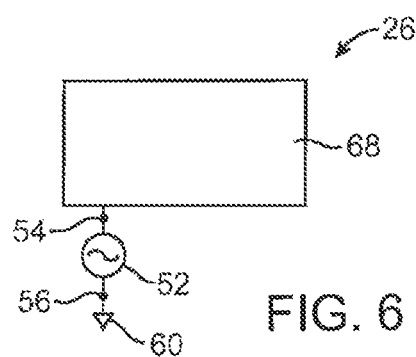
FIG. 6 is a top view of an illustrative patch antenna resonating element for one embodiment of an antenna system.
Figure 7:
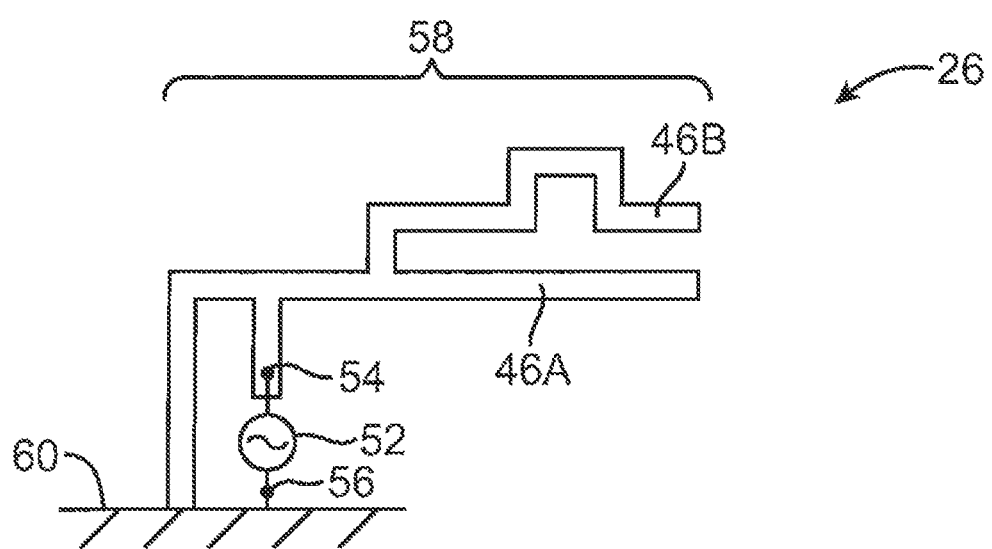
FIG. 7 is a top view of an illustrative multibranch inverted-F antenna resonating element for one embodiment of an antenna system.

Various other configurations for electrically connecting the antenna system are also contemplated. In FIG. 4, for instance, the antenna system is based on a monopole antenna configuration and the resonating element 58 has a meandering serpentine path shape. In such embodiments, the feed terminal 54 may be connected to one end of resonating element 58, and the ground feed terminal 56 may be coupled to housing 12 or another suitable ground plane element. In another embodiment as shown in FIG. 5, conductive antenna elements 62 are configured to define a closed slot 64 and an open slot 66. The antenna formed from structures 62 may be fed using positive antenna feed terminal 54 and ground antenna feed terminal 56. In this type of arrangement, slots 64 and 66 serve as antenna resonating elements for the antenna element 26. The sizes of the slots 64 and 66 may be configured so that the antenna element 26 operates in desired communications bands (e.g., 2.4 GHz and 5 GHz, etc.). Another possible configuration for the antenna system 26 is shown in FIG. 6. In this embodiment, the antenna element 26 has a patch antenna resonating element 68 and may be fed using positive antenna feed terminal 54 and ground antenna feed terminal 56. The ground 60 may be associated with housing 12 or other suitable ground plane elements in device 10. FIG. 7 shows yet another illustrative configuration that may be used for the antenna elements of the antenna system 26. As shown, antenna resonating element 58 has two main arms 46A and 46B. The arm 46A is shorter than the arm 46B and is therefore associated with higher frequencies of operation than the arm 46A. By using two or more separate resonating element structures of different sizes, the antenna resonating element 58 can be configured to cover a wider bandwidth or more than a single communications band of interest.

In certain embodiments of the present invention, the circuit structure may be particularly well suited for high frequency antennas and antenna arrays for use in base stations, repeaters (e.g., "femtocells"), relay stations, terminals, user devices, and/or other suitable components of 5G systems. As used herein, "5G" generally refers to high speed data communication over radio frequency signals. 5G networks and systems are capable of communicating data at much faster rates than previous generations of data communication standards (e.g., "4G, "LTE"). For example, as used herein, "5G frequencies" can refer to frequencies that are 1.5 GHz or more, in some embodiments about 2.0 GHz or more, in some embodiments about 2.5 GHz or higher, in some embodiments about 3.0 GHz or higher, in some embodiments from about 3 GHz to about 300 GHz, or higher, in some embodiments from about 4 GHz to about 80 GHz, in some embodiments from about 5 GHz to about 80 GHz, in some embodiments from about 20 GHz to about 80 GHz, and in some embodiments from about 28 GHz to about 60 GHz. Various standards and specifications have been released quantifying the requirements of 5G communications. As one example, the International Telecommunications Union (ITU) released the International Mobile Telecommunications-2020 ("IMT-2020") standard in 2015. The IMT-2020 standard specifies various data transmission criteria (e.g., downlink and uplink data rate, latency, etc.) for 5G. The IMT-2020 Standard defines uplink and downlink peak data rates as the minimum data rates for uploading and downloading data that a 5G system must support. The IMT-2020 standard sets the downlink peak data rate requirement as 20 Gbit/s and the uplink peak data rate as 10 Gbit/s. As another example, $3^{rd}$ Generation Partnership Project (3GPP) recently released new standards for 5G, referred to as "5G NR." 3GPP published "Release 15" in 2018 defining "Phase 1" for standardization of 5G NR. 3GPP defines 5G frequency bands generally as "Frequency Range 1" (FR1) including sub-6 GHz frequencies and "Frequency Range 2" (FR2) as frequency bands ranging from 20-60 GHz. Antenna systems described herein can satisfy or qualify as "5G" under standards released by 3GPP, such as Release 15 (2018), and/or the IMT-2020 Standard.

To achieve high speed data communication at high frequencies, antenna elements and arrays may employ small feature sizes/spacing (e.g., fine pitch technology) that can improve antenna performance. For example, the feature size (spacing between antenna elements, width of antenna elements) etc. is generally dependent on the wavelength ("$\lambda$") of the desired transmission and/or reception radio frequency propagating through the substrate dielectric on which the antenna element is formed (e.g., $n\lambda/4$ where n is an integer). Further, beamforming and/or beam steering can be employed to facilitate receiving and transmitting across multiple frequency ranges or channels (e.g., multiple-in-multiple-out (MIMO), massive MIMO).

The high frequency 5G antenna elements can have a variety of configurations. For example, the 5G antenna elements can be or include co-planar waveguide elements, patch arrays (e.g., mesh-grid patch arrays), other suitable 5G antenna configurations. The antenna elements can be configured to provide MIMO, massive MIMO functionality, beam steering, and the like. As used herein "massive" MIMO functionality generally refers to providing a large number transmission and receiving channels with an antenna array, for example 8 transmission (Tx) and 8 receive (Rx) channels (abbreviated as 8×8). Massive MIMO functionality may be provided with 8×8, 12×12, 16×16, 32×32, 64×64, or greater.

The antenna elements can have a variety of configurations and arrangements and can be fabricated using a variety of manufacturing techniques. As one example, the antenna elements and/or associated elements (e.g., ground elements, feed lines, etc.) can employ fine pitch technology. Fine pitch technology generally refers to small or fine spacing between their components or leads. For example, feature dimensions and/or spacing between antenna elements (or between an antenna element and a ground plane) can be about 1,500 micrometers or less, in some embodiments 1,250 micrometers or less, in some embodiments 750 micrometers or less (e.g., center-to-center spacing of 1.5 mm or less), 650 micrometers or less, in some embodiments 550 micrometers or less, in some embodiments 450 micrometers or less, in some embodiments 350 micrometers or less, in some embodiments 250 micrometers or less, in some embodiments 150 micrometers or less, in some embodiments 100 micrometers or less, and in some embodiments 50 micrometers or less. However, it should be understood that feature sizes and/or spacings that are smaller and/or larger may be employed within the scope of this disclosure.

As a result of such small feature dimensions, antenna systems can be achieved with a large number of antenna elements in a small footprint. For example, an antenna array can have an average antenna element concentration of greater than 1,000 antenna elements per square centimeter, in some embodiments greater than 2,000 antenna elements per square centimeter, in some embodiments greater than 3,000 antenna elements per square centimeter, in some embodiments greater than 4,000 antenna elements per square centimeter, in some embodiments greater than 6,000 antenna elements per square centimeter, and in some embodiments greater than about 8,000 antenna elements per square centimeter. Such compact arrangement of antenna elements can provide a greater number of channels for MIMO functionality per unit area of the antenna area. For example, the number of channels can correspond with (e.g., be equal to or proportional with) the number of antenna elements.

Figure 8:
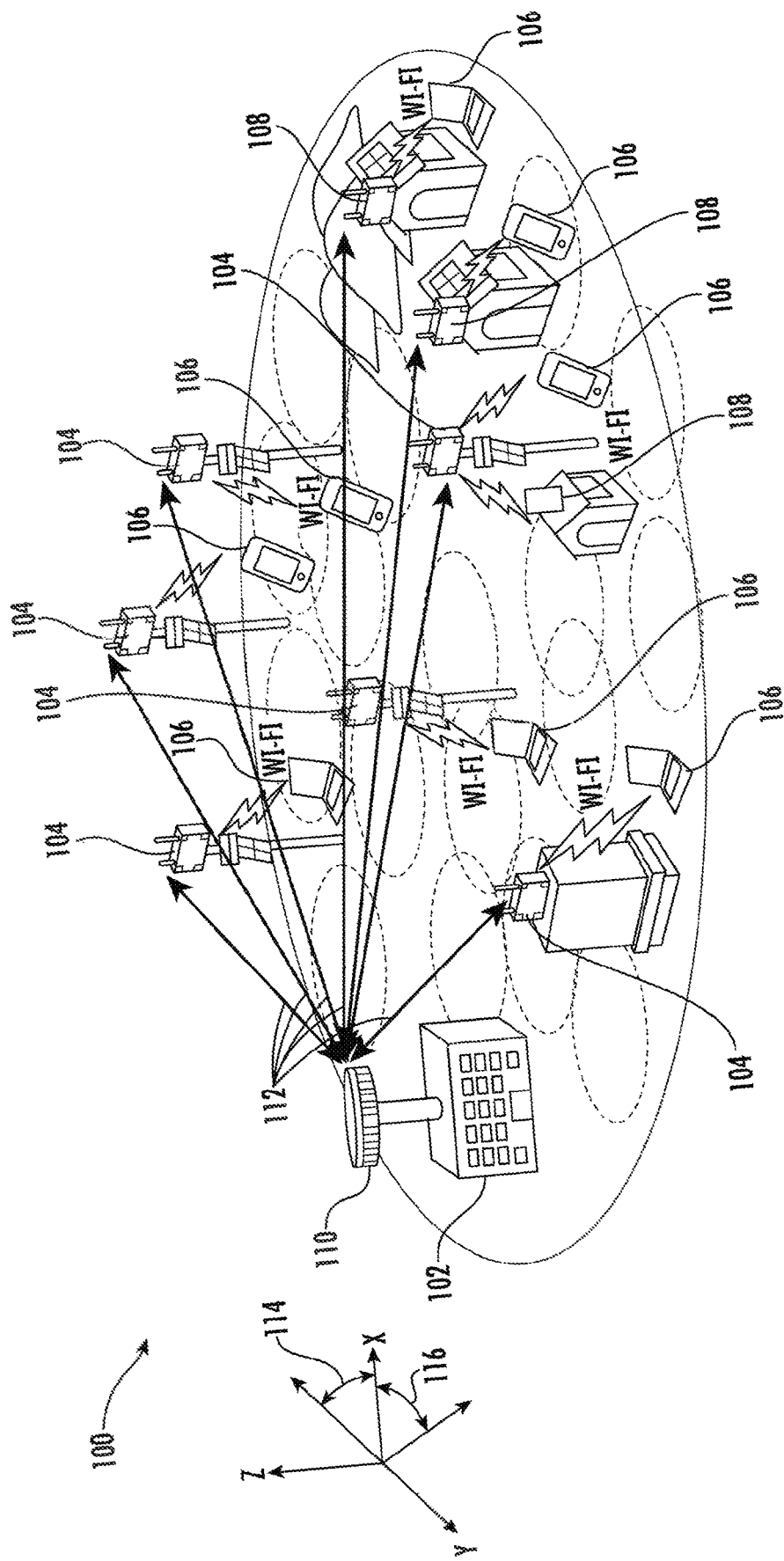
FIG. 8 depicts a 5G antenna system including a base station, one or more relay stations, one or more user computing devices, one or more or more Wi-Fi repeaters according to aspects of the present disclosure.

Referring to FIG. 8, one embodiment of a 5G antenna system 100 is shown that also includes a base station 102, one or more relay stations 104, one or more user computing devices 106, one or more Wi-Fi repeaters 108 (e.g., "femtocells"), and/or other suitable antenna components for the 5G antenna system 100. The relay stations 104 can be configured to facilitate communication with the base station 102 by the user computing devices 106 and/or other relay stations 104 by relaying or "repeating" signals between the base station 102 and the user computing devices 106 and/or relay stations 104. The base station 102 can include a MIMO antenna array 110 configured to receive and/or transmit radio frequency signals 112 with the relay station(s) 104, Wi-Fi repeaters 108, and/or directly with the user computing device(s) 106. The user computing device 106 is not necessarily limited by the present invention and include devices such as 5G smartphones.

The MIMO antenna array 110 can employ beam steering to focus or direct radio frequency signals 112 with respect to the relay stations 104. For example, the MIMO antenna array 110 can be configured to adjust an elevation angle 114 with respect to an X-Y plane and/or a heading angle 116 defined in the Z-Y plane and with respect to the Z direction. Similarly, one or more of the relay stations 104, user computing devices 106, Wi-Fi repeaters 108 can employ beam steering to improve reception and/or transmission ability with respect to MIMO antenna array 110 by directionally tuning sensitivity and/or power transmission of the device 104, 106, 108 with respect to the MIMO antenna array 110 of the base station 102 (e.g., by adjusting one or both of a relative elevation angle and/or relative azimuth angle of the respective devices).

Figure 9A:
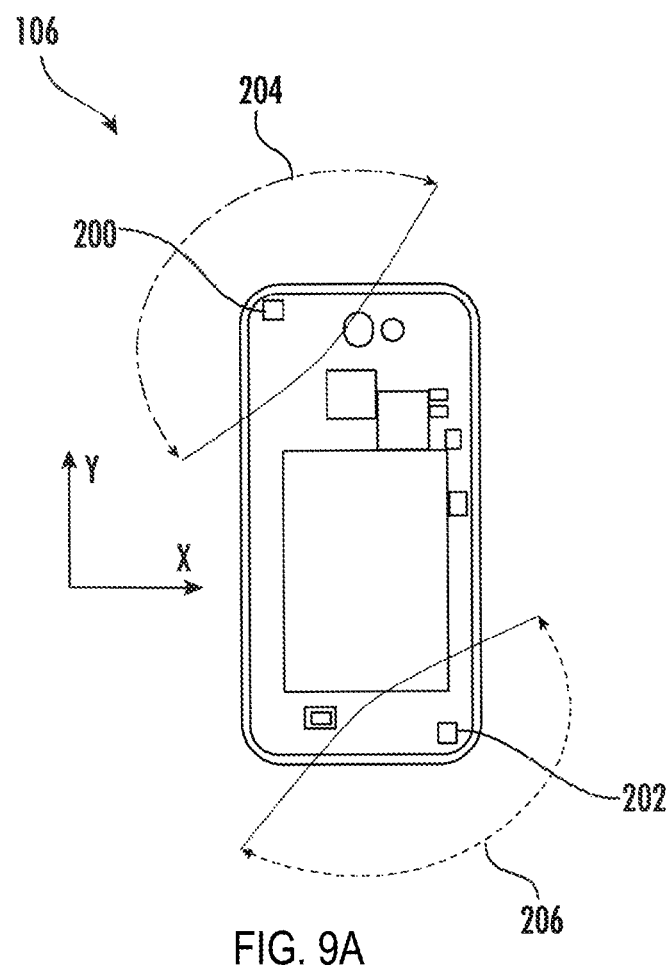
FIG. 9A illustrates a top-down view of an example user computing device including 5G antennas according to aspects of the present disclosure.
Figure 9B:
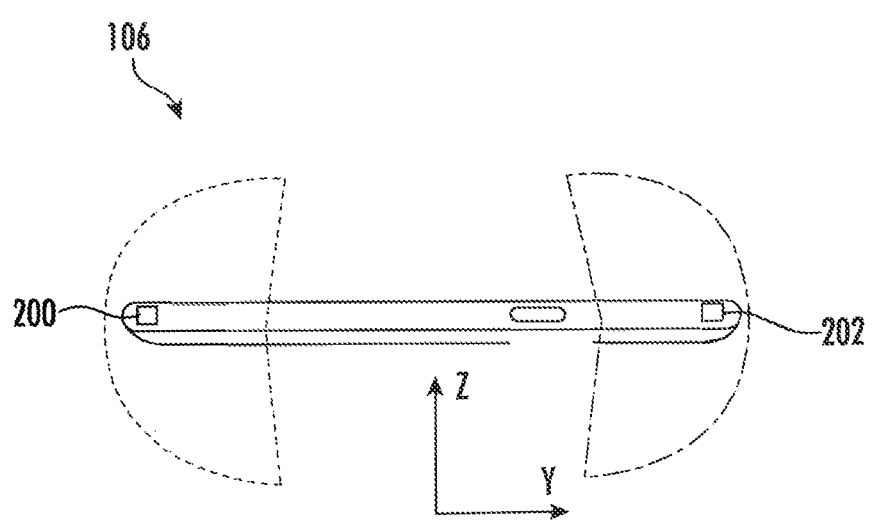
FIG. 9B illustrates a side elevation view of the example user computing device of FIG. 9A including 5G antennas according to aspects of the present disclosure.

FIGS. 9A and 9B illustrate a top-down and side elevation view, respectively, of an example user computing device 106. The user computing device 106 may include one or more antenna elements 200, 202 (e.g., arranged as respective antenna arrays). Referring to FIG. 9A, the antenna elements 200, 202 can be configured to perform beam steering in the X-Y plane (as illustrated by arrows 204, 206 and corresponding with a relative azimuth angle). Referring to FIG. 9B, the antenna elements 200, 202 can be configured to perform beam steering in the Z-Y plane (as illustrated by arrows 204, 206).

Figure 10:
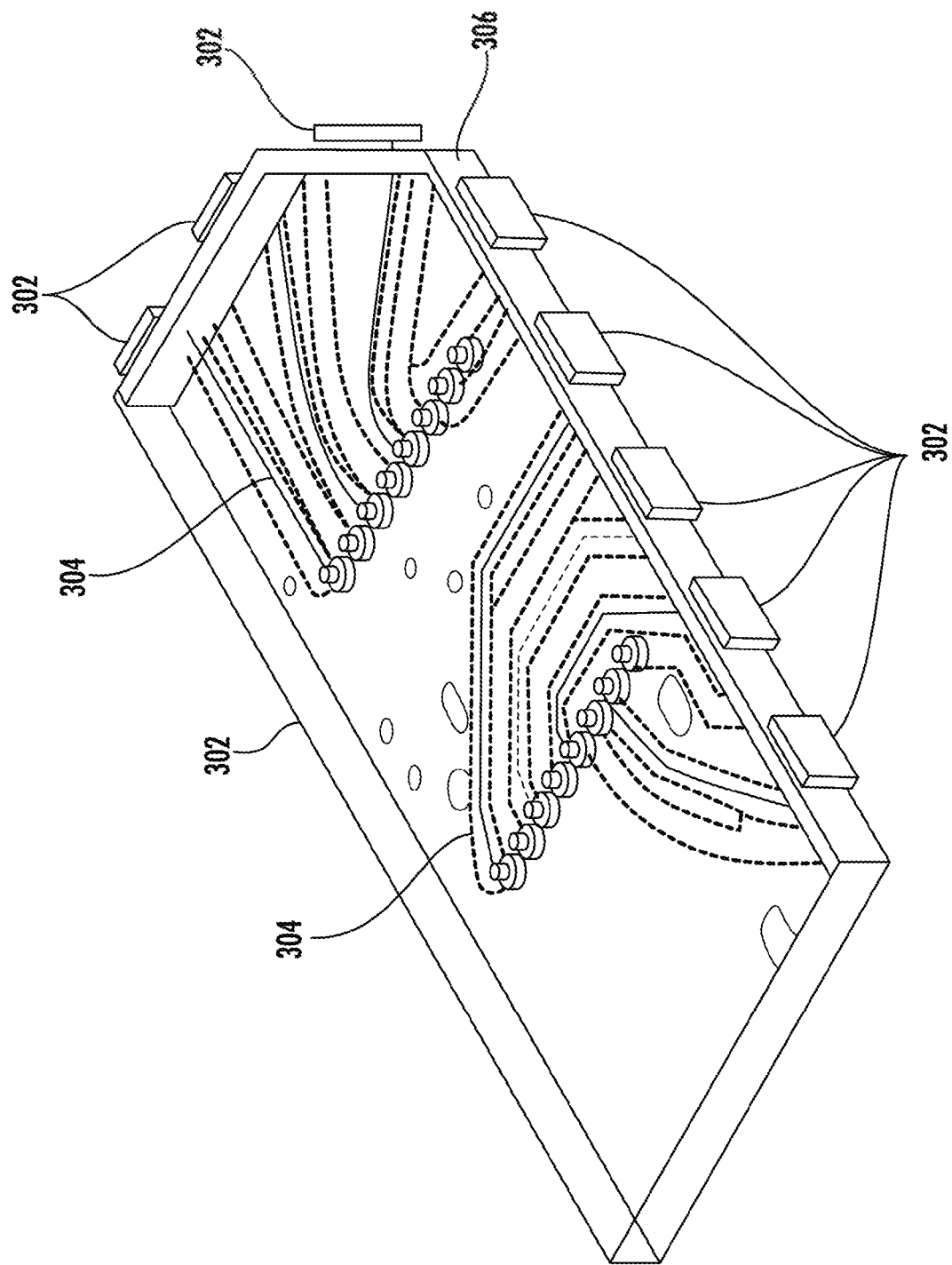
FIG. 10 illustrates an enlarged view of a portion of the user computing device of FIG. 9A.

FIG. 10 depicts a simplified schematic view of a plurality of antenna arrays 302 connected using respective feed lines 304 (e.g., with a front end module). The antenna arrays 302 can be mounted to a side surface 306 of a substrate 308, which may be formed from the polymer composition of the present invention. The antenna arrays 302 can include a plurality of vertically connected elements (e.g., as a mesh-grid array). Thus, the antenna array 302 can generally extend parallel with the side surface 306 of the substrate 308. Shielding can optionally be provided on the side surface 306 of the substrate 308 such that the antenna arrays 302 are located outside of the shielding with respect to the substrate 308. The vertical spacing distance between the vertically connected elements of the antenna array 302 can correspond with the "feature sizes" of the antenna arrays 302. As such, in some embodiments, these spacing distances may be relatively small (e.g., less than about 750 micrometers) such that the antenna array 302 is a "fine pitch" antenna array 302.

Figure 11:
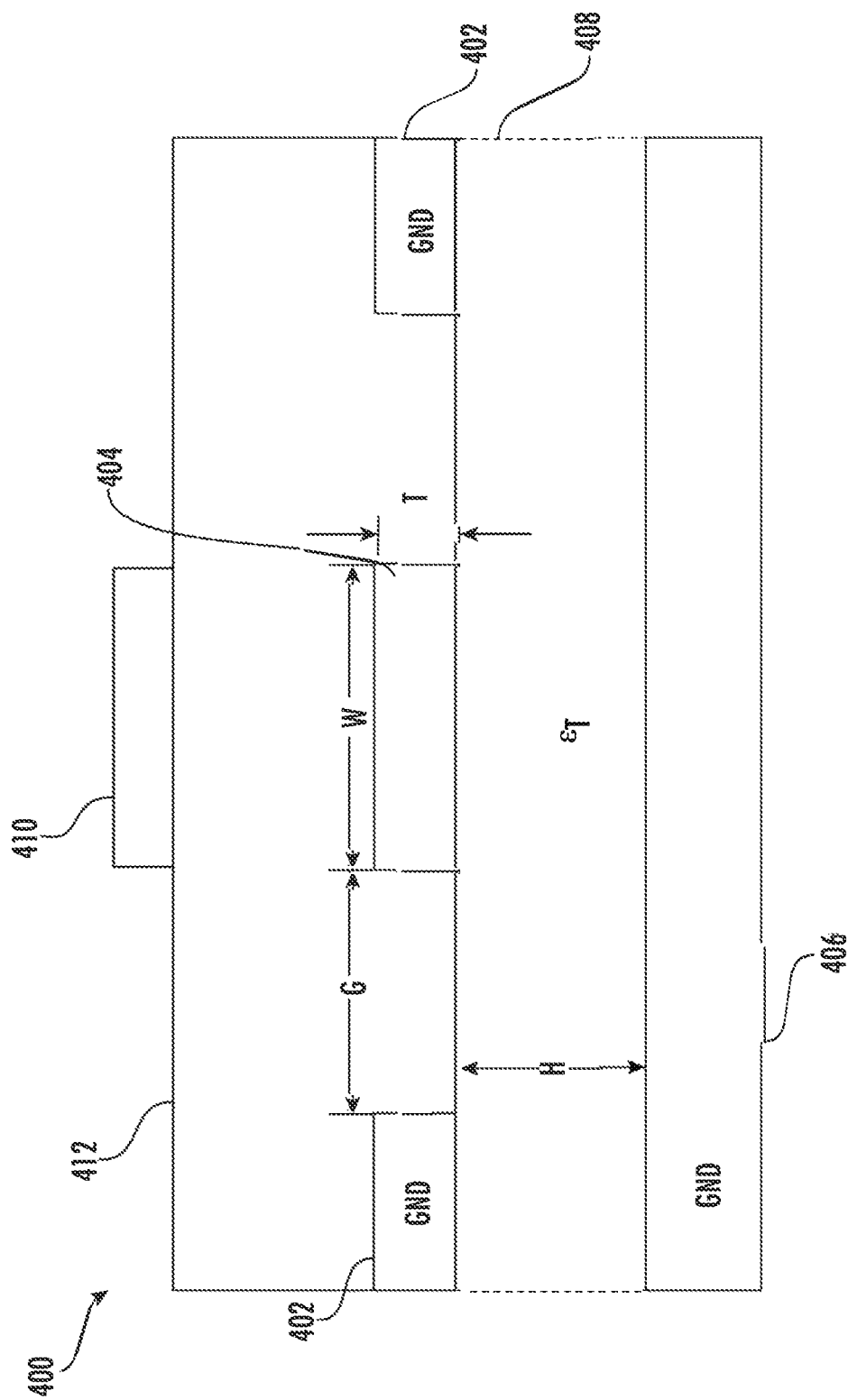
FIG. 11 illustrates a side elevation view of co-planar waveguide antenna array configuration according to aspects of the present disclosure.

FIG. 11 illustrates a side elevation view of a co-planar waveguide antenna 400 configuration. One or more co-planar ground layers 402 can be arranged parallel with an antenna element 404 (e.g., a patch antenna element). Another ground layer 406 may be spaced apart from the antenna element by a substrate 408, which may be formed from the polymer composition of the present invention. One or more additional antenna elements 410 can be spaced apart from the antenna element 404 by a second layer or substrate 412, which may also be formed from the polymer composition of the present invention. The dimensions "G" and "W" may correspond with "feature sizes" of the antenna 400. The "G" dimension may correspond with a distance between the antenna element 404 and the co-planar ground layer(s) 406. The "W" dimension can correspond with a width (e.g., linewidth) of the antenna element 404. As such, in some embodiments, dimensions "G" and "W" may be relatively small (e.g., less than about 750 micrometers) such that the antenna 400 is a "fine pitch" antenna 400.

Figure 12A:
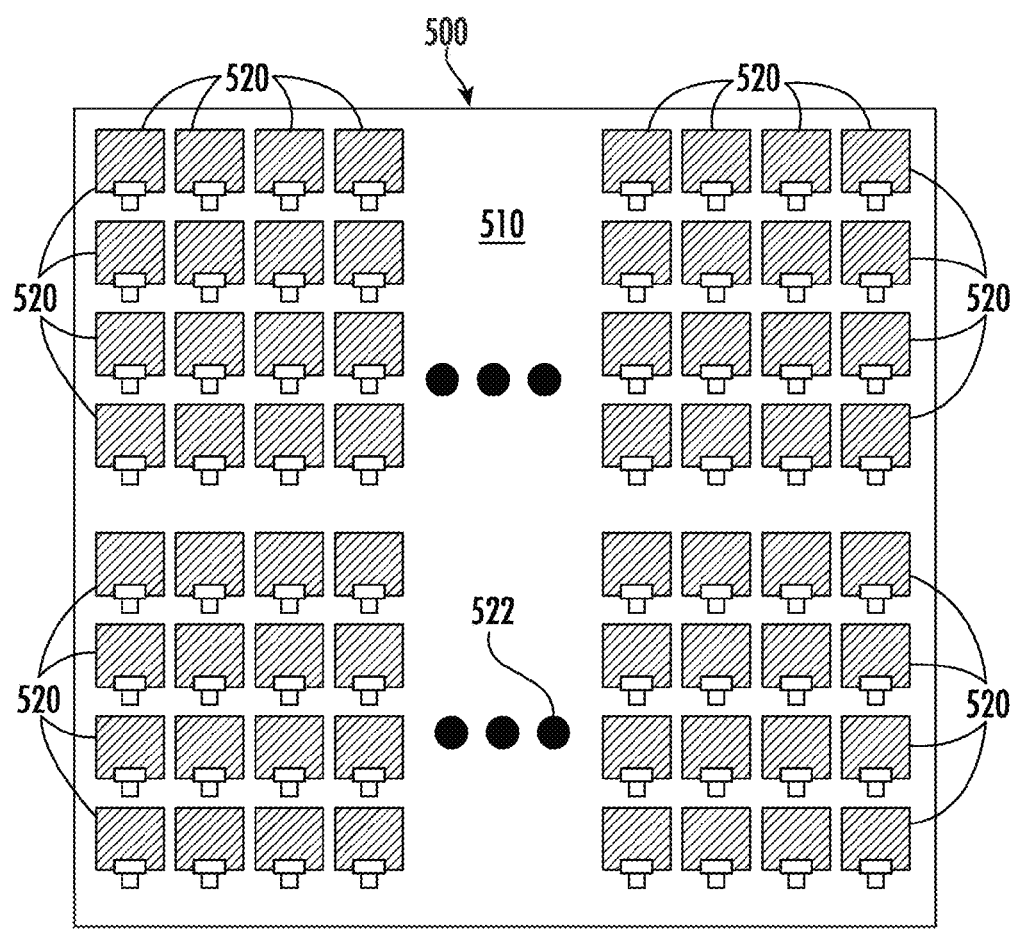
FIG. 12A illustrates an antenna array for massive multiple-in-multiple-out configurations according to aspects of the present disclosure.

FIG. 12A illustrates an antenna array 500 according to another aspect of the present disclosure. The antenna array 500 can include a substrate 510, which may be formed from the polymer composition of the present invention, and a plurality of antenna elements 520 formed thereon. The plurality of antenna elements 520 can be approximately equally sized in the X- and/or Y-directions (e.g., square or rectangular). The plurality of antenna elements 520 can be spaced apart approximately equally in the X- and/or Y-directions. The dimensions of the antenna elements 520 and/or spacing therebetween can correspond with "feature sizes" of the antenna array 500. As such, in some embodiments, the dimensions and/or spacing may be relatively small (e.g., less than about 750 micrometers) such that the antenna array 500 is a "fine pitch" antenna array 500. As illustrated by the ellipses 522, the number of columns of antenna elements 520 illustrated in FIG. 12 is provided as an example only. Similarly, the number of rows of antenna element 520 is provided as an example only.

The tuned antenna array 500 can be used to provide massive MIMO functionality, for example in a base station (e.g., as described above with respect to FIG. 8). More specifically, radio frequency interactions between the various elements can be controlled or tuned to provide multiple transmitting and/or receiving channels. Transmitting power and/or receiving sensitivity can be directionally controlled to focus or direct radio frequency signals, for example as described with respect to the radio frequency signals 112 of FIG. 8. The tuned antenna array 500 can provide a large number of antenna elements 522 in a small footprint. For example, the tuned antenna 500 can have an average antenna element concentration of 1,000 antenna elements per square cm or greater. Such compact arrangement of antenna elements can provide a greater number of channels for MIMO functionality per unit area. For example, the number of channels can correspond with (e.g., be equal to or proportional with) the number of antenna elements.

Figure 12C:
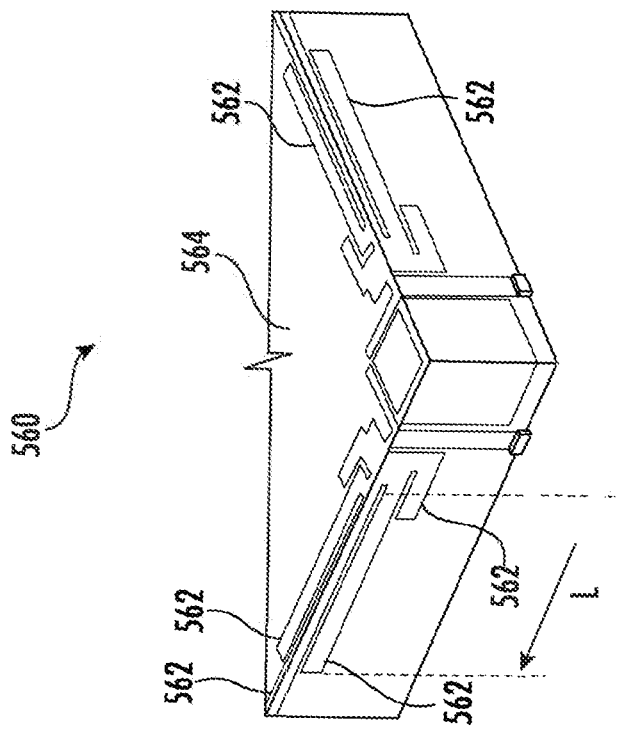
FIG. 12C illustrates an example antenna configuration according to aspects of the present disclosure.
Figure 12B:
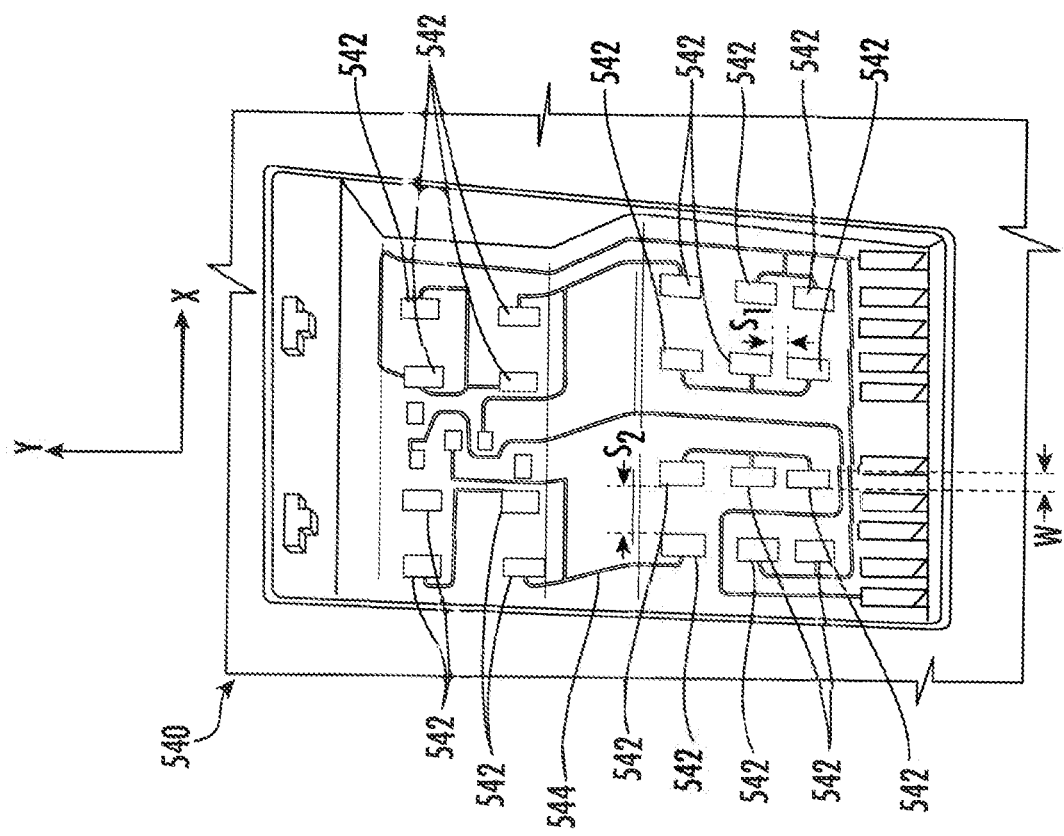
FIG. 12B illustrates an antenna array formed with laser direct structuring according to aspects of the present disclosure.

FIG. 12B illustrates an antenna array 540 formed with laser direct structuring, which may optionally be employed to form the antenna elements. The antenna array 540 can include a plurality of antenna elements 542 and plurality of feed lines 544 connecting the antenna elements 542 (e.g., with other antenna elements 542, a front end module, or other suitable component). The antenna elements 542 can have respective widths "w" and spacing distances "$S_1$" and "$S_2$" therebetween (e.g., in the X-direction and Y-direction, respectively). These dimensions can be selected to achieve 5G radio frequency communication at a desired 5G frequency. More specifically, the dimensions can be selected to tune the antenna array 540 for transmission and/or reception of data using radio frequency signals that are within the 5G frequency spectrum. The dimensions can be selected based on the material properties of the substrate. For example, one or more of "w", "$S_1$," or "$S_2$" can correspond with a multiple of a propagation wavelength ("λ") of the desired frequency through the substrate material (e.g., nλ/4 where n is an integer).

As one example, λ can be calculated as follows:

$$\lambda = \frac{c}{f\sqrt{\epsilon_R}}$$

where c is the speed of light in a vacuum, $\epsilon_R$ is the dielectric constant of the substrate (or surrounding material), f is the desired frequency.

FIG. 12C illustrates an example antenna configuration 560 according to aspects of the present disclosure. The antenna configuration 560 can include multiple antenna elements 562 arranged in parallel long edges of a substrate 564, which may be formed from the polymer composition of the present invention. The various antenna elements 562 can have respective lengths, "L" (and spacing distances therebetween) that tune the antenna configuration 560 for reception and/or transmission at a desired frequency and/or frequency range. More specifically, such dimensions can be selected based on a propagation wavelength, λ, at the desired frequency for the substrate material, for example as described above with reference to FIG. 12B.

Figure 13C:
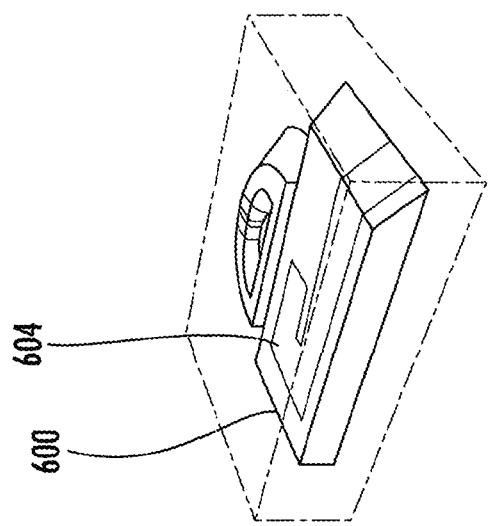
FIGS. 13A through 13C depict simplified sequential diagrams of a laser direct structuring manufacturing process that can be used to form an antenna system.
Figure 13B:
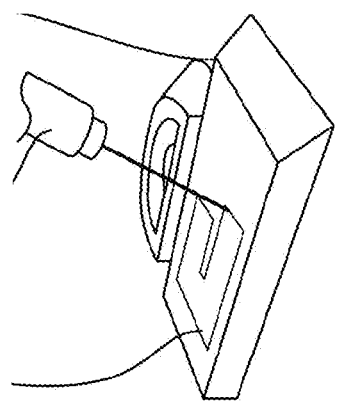
Figure 13A:
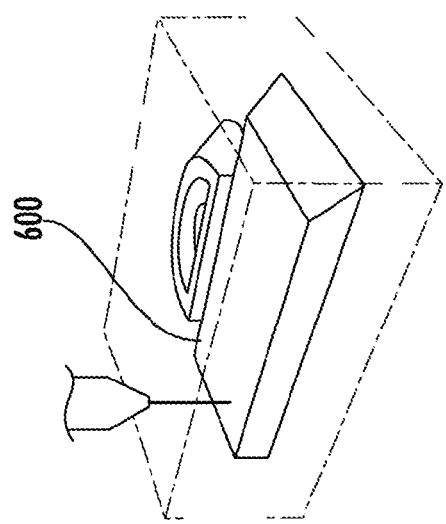

FIGS. 13A through 13C depict simplified sequential diagrams of a laser direct structuring manufacturing process that can be used to form antenna elements and/or arrays according to aspects of the present disclosure. Referring to FIG. 13A, a substrate 600 can be formed from the polymer composition of the present invention using any desired technique (e.g., injection molding). In certain embodiments, as shown in FIG. 13B, a laser 602 can be used to activate the laser activatable additive to form a circuit pattern 604 that can include one or more of the antenna elements and/or arrays. For example, the laser can melt conductive particles in the polymer composition to form the circuit pattern 604. Referring to FIG. 13C, the substrate 600 can be submerged in an electroless copper bath to plate the circuit pattern 604 and form the antenna elements, elements arrays, other components, and/or conductive lines therebetween.

The present invention may be better understood with reference to the following examples.

Test Methods

Melt Viscosity: The melt viscosity (Pa-s) may be determined in accordance with ISO Test No. 11443:2014 at a shear rate of 400 s$^{-1}$ and temperature 15° C. above the melting temperature (e.g., about 350° C.) using a Dynisco LCR7001 capillary rheometer. The rheometer orifice (die) had a diameter of 1 mm, length of 20 mm, L/D ratio of 20.1, and an entrance angle of 180°. The diameter of the barrel was 9.55 mm+0.005 mm and the length of the rod was 233.4 mm.

Melting Temperature: The melting temperature ("Tm") may be determined by differential scanning calorimetry ("DSC") as is known in the art. The melting temperature is the differential scanning calorimetry (DSC) peak melt temperature as determined by ISO Test No. 11357-3:2018. Under the DSC procedure, samples were heated and cooled at 20° C. per minute as stated in ISO Standard 10350 using DSC measurements conducted on a TA Q2000 Instrument.

Deflection Temperature Under Load ("DTUL"): The deflection temperature under load may be determined in accordance with ISO Test No. 75-2:2013 (technically equivalent to ASTM D648). More particularly, a test strip sample having a length of 80 mm, thickness of 10 mm, and width of 4 mm may be subjected to an edgewise three-point bending test in which the specified load (maximum outer fibers stress) was 1.8 Megapascals. The specimen may be lowered into a silicone oil bath where the temperature is raised at 2° C. per minute until it deflects 0.25 mm (0.32 mm for ISO Test No. 75-2:2013).

Tensile Modulus, Tensile Stress, and Tensile Elongation: Tensile properties may be tested according to ISO Test No. 527:2019 (technically equivalent to ASTM D638). Modulus and strength measurements may be made on the same test strip sample having a length of 80 mm, thickness of 10 mm, and width of 4 mm. The testing temperature may be 23° C., and the testing speeds may be 1 or 5 mm/min.

Flexural Modulus, Flexural Stress, and Flexural Elongation: Flexural properties may be tested according to ISO Test No. 178:2019 (technically equivalent to ASTM D790). This test may be performed on a 64 mm support span. Tests may be run on the center portions of uncut ISO 3167 multi-purpose bars. The testing temperature may be 23° C. and the testing speed may be 2 mm/min.

Charpy Impact Strength: Charpy properties may be tested according to ISO Test No. 179-1:2010) (technically equivalent to ASTM D256-10, Method B). This test may be run using a Type 1 specimen size (length of 80 mm, width of 10 mm, and thickness of 4 mm). When testing the notched impact strength, the notch may be a Type A notch (0.25 mm base radius). Specimens may be cut from the center of a multi-purpose bar using a single tooth milling machine. The testing temperature may be 23° C.

Dielectric Constant ("Dk") and Dissipation Factor ("Df"): The dielectric constant (or relative static permittivity) and dissipation factor are determined using a known split-post dielectric resonator technique, such as described in Baker-Jarvis, et al., *IEEE Trans. on Dielectric and Electrical Insulation*, 5(4), p. 571 (1998) and Krupka, et al., *Proc. 7$^{th}$ International Conference on Dielectric Materials: Measure-* ments and Applications, *IEEE Conference Publication No. 430* (September 1996). More particularly, a plaque sample having a size of 80 mm×90 mm×3 mm was inserted between two fixed dielectric resonators. The resonator measured the permittivity component in the plane of the specimen. Five (5) samples are tested and the average value is recorded. The split-post resonator can be used to make dielectric measurements in the low gigahertz region, such as 1 GHz from 2 GHz.

Heat Cycle Test: Specimens are placed in a temperature control chamber and heated/cooled within a temperature range of from −30° C. and 100° C. Initially, the samples are heated until reaching a temperature of 100° C., when they were immediately cooled. When the temperature reaches −30° C., the specimens are immediately heated again until reaching 100° C. Twenty three (23) heating/cooling cycles may be performed over a 3-hour time period.

Surface/Volume Resistivity: The surface and volume resistivity values may be determined in accordance with IEC 62631-3-1:2016 or ASTM D257-14. According to this procedure, a standard specimen (e.g., 1 meter cube) is placed between two electrodes. A voltage is applied for sixty (60) seconds and the resistance is measured. The surface resistivity is the quotient of the potential gradient (in V/m) and the current per unit of electrode length (in A/m), and generally represents the resistance to leakage current along the surface of an insulating material. Because the four (4) ends of the electrodes define a square, the lengths in the quotient cancel and surface resistivities are reported in ohms, although it is also common to see the more descriptive unit of ohms per square. Volume resistivity is also determined as the ratio of the potential gradient parallel to the current in a material to the current density. In SI units, volume resistivity is numerically equal to the direct-current resistance between opposite faces of a one-meter cube of the material (ohm-m or ohm-cm).

Example 1

Samples 1-4 are formed from various percentages of a liquid crystalline polymer ("LCP 1" and "LCP 2"), wollastonite fibers (Nyglos™ 8), carbon black pigment, carbon fibers, and a lubricant (Glycolube™ P). LCP 1 is formed from 60 mol. % HBA, 5 mol. % HNA, 12 mol. % BP, 17.5 mol. % TA, and 5 mol. % APAP. LCP 2 is formed from 73 mol. % HBA and 27 mol. % HNA. Compounding was performed using an 18-mm single screw extruder. The samples are injection molded into plaques (60 mm×60 mm).

TABLE 1

| Sample | 1 | 2 | 3 | 4 |
|---|---|---|---|---|
| LCP 1 | 37.2 | 47.2 | 57.2 | 62.2 |
| LCP 2 | 21.0 | 14.0 | 7.0 | 3.5 |
| Wollastonite Fibers | 30 | 30 | 30 | 30 |
| Carbon Black Pigment | 2.5 | 2.5 | 2.5 | 2.5 |
| Carbon Fibers | 9.0 | 6.0 | 3.0 | 1.5 |
| Lubricant | 0.3 | 0.3 | 0.3 | 0.3 |

Samples 1-4 were tested for thermal and mechanical properties. The results are set forth below in Table 2.

TABLE 2

| Sample | 1 | 2 | 3 | 4 |
|---|---|---|---|---|
| Surface Resistivity (ohm) | 4.20E+15 | 7.30E+15 | 1.40E+16 | 6.40E+15 |
| Volume Resistivity (ohm-m) | 5.00E+13 | 1.60E+14 | 1.20E+14 | 9.30E+13 |
| Dielectric Constant (2 GHz) | — | — | 13.1 | 12.5 |
| Dissipation Factor (2 GHz) | — | — | 0.0170 | 0.0176 |
| Notched Charpy (kJ/m$^2$) | 7.1 | 6.7 | 7.6 | 8.1 |
| Unnotched Charpy (kJ/m$^2$) | 11 | 18 | 34 | 28 |
| Tensile Strength (MPa) | 124 | 127 | 133 | 134 |
| Tensile Modulus (MPa) | 18,916 | 16,690 | 13,067 | 14,278 |
| Tensile Elongation (%) | 1.29 | 1.5 | 2.12 | 1.9 |
| Flexural Strength (MPa) | 177 | 179 | 166 | 171 |
| Flexural Modulus (MPa) | 18,466 | 16,180 | 13,364 | 14,466 |
| Flexural Elongation (%) | 1.59 | 1.77 | 2.54 | 2.21 |
| Melt Viscosity (Pa-s) at 1,000 s$^{-1}$ | 38.3 | 42.3 | 40.3 | 41.8 |
| Melting Temperature (° C., 1$^{st}$ heat of DSC) | 319.15 | 317.2 | 328.11 | 325.28 |
| DTUL (1.8 MPa, ° C.) | 235 | 231 | 234 | 233 |

Samples 3-4 were also subjected to a heat cycle test as described above. Upon testing, it was determined that the resulting dissipation factor for the samples was 0.021 and 0.015, respectively. Thus, the ratio of the dissipation factor after heat cycle testing to the initial dissipation factor for Samples 3 and 4 was 1.24 and 0.86, respectively. Upon testing, it was also determined that the resulting dielectric constant for the samples was 12.9 and 12.6, respectively. Thus, the ratio of the dielectric constant after heat cycle testing to the initial dielectric constant for Samples 3 and 4 was 0.98 and 1.01, respectively.

Example 2

Samples 5-9 are formed from various percentages of a liquid crystalline polymer ("LCP 1" and "LCP 2"), Nyglos™ 8, carbon black pigment, graphite, and Glycolube™ P. Compounding was performed using an 18-mm single screw extruder. The samples are injection molded into plaques (60 mm×60 mm).

TABLE 3

| Sample | 1 | 2 | 3 | 4 |
|---|---|---|---|---|
| LCP 1 | 37.2 | 47.2 | 57.2 | 62.2 |
| LCP 2 | 22.5 | 15.5 | 7.5 | 3.75 |
| Wollastonite Fibers | 30 | 30 | 30 | 30 |
| Carbon Black Pigment | 2.5 | 2.5 | 2.5 | 2.5 |
| Graphite | 7.5 | 4.5 | 2.5 | 1.25 |
| Lubricant | 0.3 | 0.3 | 0.3 | 0.3 |

Samples 5-9 were tested for thermal and mechanical properties. The results are set forth below in Table 4.

TABLE 4

| Sample | 5 | 6 | 7 | 8 |
|---|---|---|---|---|
| Surface Resistivity (ohm) | 4.10E+16 | 2.80E+17 | 1.40E+16 | 3.50E+16 |
| Volume Resistivity (ohm-m) | 1.10E+14 | 3.50E+14 | 2.30E+14 | 7.80E+13 |
| Dielectric Constant (2 GHz) | 12.6 | 8.8 | 6.3 | — |
| Dissipation Factor (2 GHz) | 0.0492 | 0.0201 | 0.009 | — |
| Notched Charpy (kJ/m$^2$) | 4.3 | 5.3 | 7.8 | 12.6 |
| Unnotched Charpy (kJ/m$^2$) | 26 | 30 | 43 | 50 |
| Tensile Strength (MPa) | 109 | 132 | 139 | 130 |
| Tensile Modulus (MPa) | 13491 | 14737 | 14562 | 14229 |
| Tensile Elongation (%) | 1.53 | 1.68 | 1.96 | 1.79 |
| Flexural Strength (MPa) | 144 | 167 | 177 | 176 |
| Flexural Modulus (MPa) | 13689 | 13858 | 14259 | 14091 |
| Flexural Elongation (%) | 1.7 | 2.4 | 2.54 | 2.47 |
| Melt Viscosity (Pa-s) at 1,000 s$^{-1}$ | 46.7 | 45.5 | 43.5 | 39.4 |
| Melting Temperature (° C., 1$^{st}$ heat of DSC) | 329.28 | 327.96 | 330.63 | 329.94 |
| DTUL (1.8 MPa, ° C.) | 221 | 228 | 234 | 239 |

Samples 5-7 were also subjected to a heat cycle test as described above. Upon testing, it was determined that the resulting dissipation factor for the samples was 0.0578, 0.0214, and 0.0098, respectively. Thus, the ratio of the dissipation factor after heat cycle testing to the initial dissipation factor for Samples 5, 6, and 7 was 1.17, 1.06, and 1.09, respectively. Upon testing, it was also determined that the resulting dielectric constant for the samples was 12.6, 8.9, and 6.3, respectively. Thus, the ratio of the dielectric constant after heat cycle testing to the initial dielectric constant for Samples 5, 6, and 7 was 1.0, 1.0, and, 1.0, respectively.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A circuit structure comprising:
   a substrate comprising a polymer composition, the polymer composition comprising an electrically conductive filler distributed within a polymer matrix, wherein the polymer matrix contains at least one thermoplastic high performance polymer having a deflection temperature under load of about 40° C. or more as determined in accordance with ISO 75-2:2013 at a load of 1.8 MPa, and further wherein the polymer composition exhibits a dielectric constant of about 4 or more and a dissipation factor of about 0.3 or less, as determined at a frequency of 2 GHz; and
   one or more conductive elements disposed on the substrate.

2. The circuit structure of claim 1, wherein the composition exhibits a dielectric constant after being exposed to a temperature cycle of from about −30° C. to about 100° C., wherein the ratio of the dielectric constant after the temperature cycle to the dielectric constant prior to the heat cycle is about 0.8 or more.

3. The circuit structure of claim 1, wherein the composition exhibits a dissipation factor after being exposed to a temperature cycle of from about −30° C. to about 100° C., wherein the ratio of the dissipation factor after the temperature cycle to the dissipation factor prior to the heat cycle is about 1.3 or less.

4. The circuit structure of claim 1, wherein the thermoplastic high performance polymer has a deflection temperature under load of from about 150° C. to about 310° C. as determined in accordance with ISO 75-2:2013 at a load of 1.8 MPa.

5. The circuit structure of claim 1, wherein the thermoplastic high performance polymer has a glass transition temperature of from about 100° C. to about 320° C. and/or a melting temperature of from about 200° C. to about 410° C.

6. The circuit structure of claim 1, wherein the thermoplastic high performance polymer includes a polyphenylene ether, polyphenylene oxide, polycarbonate, polyarylene sulfide, polyester, polyimide, polyimide, liquid crystalline polymer, or a combination thereof.

7. The circuit structure of claim 6, wherein the thermoplastic high performance polymer includes a wholly aromatic liquid crystalline polymer.

8. The circuit structure of claim 7, wherein the liquid crystalline polymer has a total amount of repeating units derived from naphthenic hydroxycarboxylic and/or naphthenic dicarboxylic acids of about 15 mol. % or less.

9. The circuit structure of claim 8, wherein the liquid crystalline polymer contains HBA in an amount of from about 30 mol. % to about 70 mol. %, IA and/or TA in an amount of from about 2 mol. % to about 30 mol. %, and BP and/or HQ in an amount of from about 2 mol. % to about 40 mol. %.

10. The circuit structure of claim 1, wherein the polymer composition exhibits a volume resistivity of from about $1 \times 10^{10}$ ohm-m to about $1 \times 10^{16}$ ohm-m and/or a surface resistivity of from about $1 \times 10^{12}$ ohm to about $1 \times 10^{18}$ ohm, as determined at a temperature of about 20° C. in accordance with ASTM D257-14.

11. The circuit structure of claim 1, wherein the polymer composition is free of spinel crystals.

12. The circuit structure of claim 1, wherein the polymer matrix constitutes from about 30 wt. % to about 80 wt. % of the polymer composition.

13. The circuit structure of claim 1, wherein the electrically conductive filler has a volume resistivity of less than about 1 ohm-cm.

14. The circuit structure of claim 1, wherein the electrically conductive filler includes a carbon material.

15. The circuit structure of claim 14, wherein the carbon material includes graphite, carbon black, carbon fibers, graphene, carbon nanotubes, or a combination thereof.

16. The circuit structure of claim 1, wherein the electrically conductive filler is present in the polymer composition in an amount of from about 0.5 to about 20 parts by weight per 100 parts by weight of the polymer matrix.

17. The circuit structure of claim 1, wherein the polymer composition further comprises a mineral filler.

18. The circuit structure of claim 17, wherein the mineral filler is present in the polymer composition in an amount of from about 10 to about 80 parts by weight per 100 parts by weight of the polymer matrix.

19. The circuit structure of claim 17, wherein the weight ratio of the mineral filler to the electrically conductive filler ranges from about 2 to about 500.

20. The circuit structure of claim 17, wherein the mineral filler contains mineral particles, mineral fibers, or a combination thereof.

21. The circuit structure of claim 20, wherein the mineral particles include talc, mica, or a combination thereof.

22. The circuit structure of claim 20, wherein the mineral fibers include wollastonite.

23. The circuit structure of claim 22, wherein the mineral fibers have a median diameter of from about 1 to about 35 micrometers.

24. The circuit structure of claim 22, wherein the mineral fibers have an aspect ratio of from about 1 to about 50.

25. The circuit structure of claim 1, wherein the polymer composition has a melt viscosity of from about 10 to about 250 Pa-s, as determined in accordance with ISO Test No. 11443:2014 at a shear rate of 1,000 s$^{-1}$ and temperature that is 15° C. above the melting temperature of the composition.

26. The circuit structure of claim 1, wherein the conductive elements include copper, nickel, or a combination thereof.

27. A method of forming the circuit structure of claim 1, the method comprising:

molding the substrate;
forming a pattern on the surface of a substrate; and
subjecting the patterned surface to a plating process to form the conductive elements.

28. The method of claim 27, wherein the pattern is formed by a process that includes laser ablation.

29. The method of claim 27, further comprising forming a seed layer on the surface prior to the plating process.

30. The method of claim 27, wherein the plating process includes electroless plating.

31. An antenna system that comprises the circuit structure of claim 1, wherein the conductive elements are antenna elements configured to transmit and receive radio frequency signals.

32. The antenna system of claim 31, wherein the radio frequency signals are 5G signals.

33. The antenna system of claim 31, wherein the at least one antenna elements have a feature size that is less than about 1,500 micrometers.

34. The antenna system of claim 31, wherein antenna elements are spaced apart by a spacing distance that is less than about 1,500 micrometers.

35. The antenna system of claim 31, wherein at least 16 antenna elements are disposed on the substrate.

36. The antenna system of claim 31, wherein the antenna elements are arranged in an array.

37. The antenna system of claim 36, wherein the array is configured for at least 8 transmission channels and at least 8 reception channels.

38. The antenna system of claim 36, wherein the array has an average antenna element concentration of greater than 1,000 antenna elements per square centimeter.

* * * * *